US011476256B2

(12) United States Patent
Juengling

(10) Patent No.: US 11,476,256 B2
(45) Date of Patent: Oct. 18, 2022

(54) INTEGRATED ASSEMBLIES HAVING BODY CONTACT REGIONS PROXIMATE TRANSISTOR BODY REGIONS; AND METHODS UTILIZING BOWL ETCHES DURING FABRICATION OF INTEGRATED ASSEMBLIES

(71) Applicant: Micron Technology, Inc., Boise, ID (US)

(72) Inventor: Werner Juengling, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 66 days.

(21) Appl. No.: 16/995,562

(22) Filed: Aug. 17, 2020

(65) Prior Publication Data

US 2020/0381438 A1    Dec. 3, 2020

Related U.S. Application Data

(62) Division of application No. 16/213,172, filed on Dec. 7, 2018, now Pat. No. 10,784,264.

(51) Int. Cl.
   *H01L 21/762*   (2006.01)
   *H01L 27/108*   (2006.01)
   *H01L 21/308*   (2006.01)

(52) U.S. Cl.
   CPC ...... *H01L 27/10882* (2013.01); *H01L 21/308* (2013.01); *H01L 21/76232* (2013.01); *H01L 27/10808* (2013.01)

(58) Field of Classification Search
   None
   See application file for complete search history.

(56) References Cited

U.S. PATENT DOCUMENTS

| 8,878,271 | B2 | 11/2014 | Karda |
| 2006/0292787 | A1 | 12/2006 | Wang |
| 2009/0050867 | A1 | 2/2009 | Wells |
| 2011/0037142 | A1* | 2/2011 | Huang ............... H01L 21/76254 257/510 |
| 2012/0080725 | A1 | 4/2012 | Manos |
| 2016/0260664 | A1 | 9/2016 | Wells |

* cited by examiner

*Primary Examiner* — Daniel Whalen
(74) *Attorney, Agent, or Firm* — Wells St. John P.S.

(57) ABSTRACT

Some embodiments include an integrated assembly having a semiconductor-containing structure with a body region vertically between an upper region and a lower region. The upper region includes a first source/drain region. The lower region is split into two legs which are both joined to the body region. One of the legs includes a second source/drain region and the other of the legs includes a body contact region. The first and second source/drain regions are of a first conductivity type, and the body contact region is of a second conductivity type which is opposite to the first conductivity type. An insulative material is adjacent to the body region. A conductive gate is adjacent to the insulative material. A transistor includes the semiconductor-containing structure, the conductive gate and the insulative material. Some embodiments include methods of forming integrated assemblies.

39 Claims, 37 Drawing Sheets

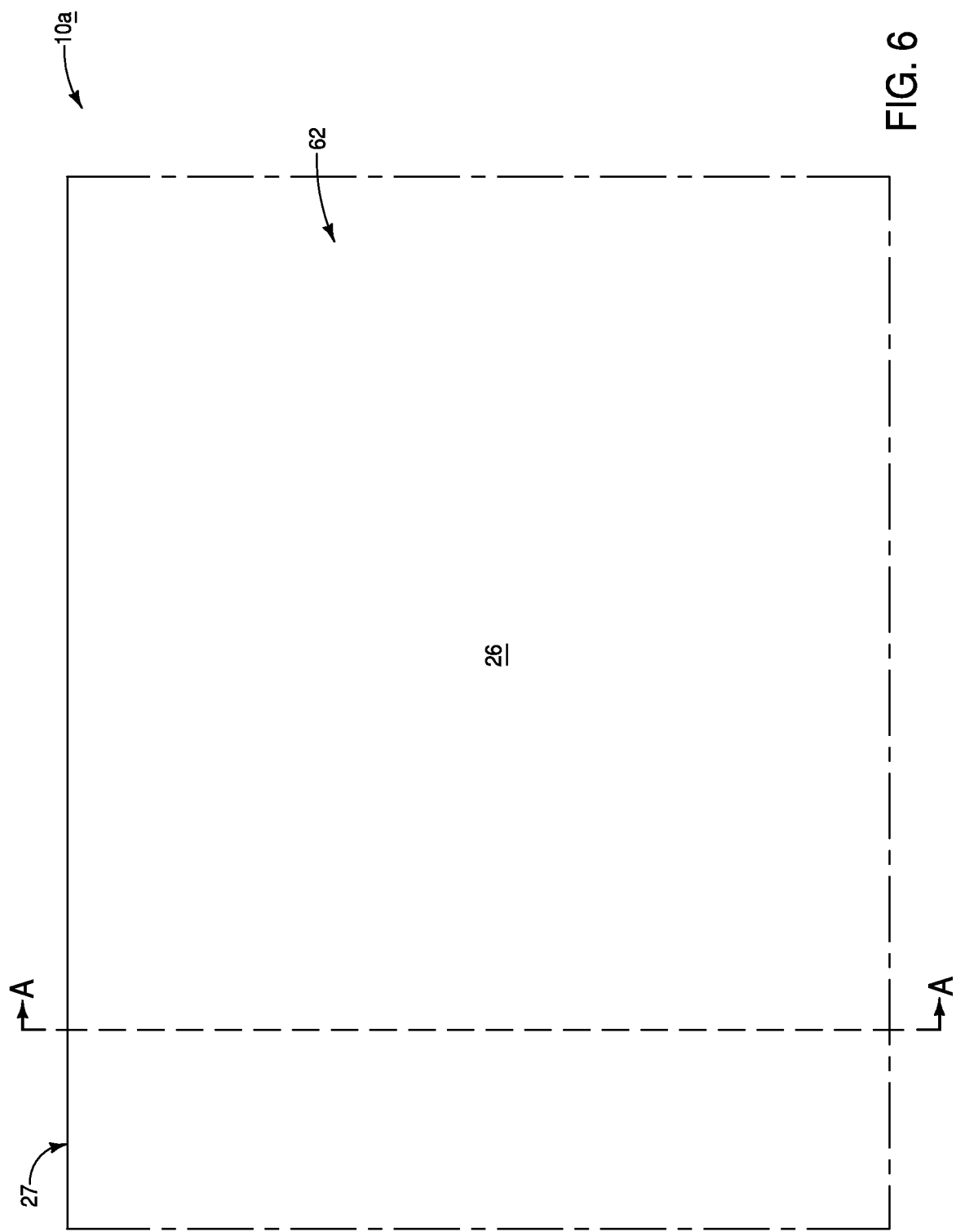

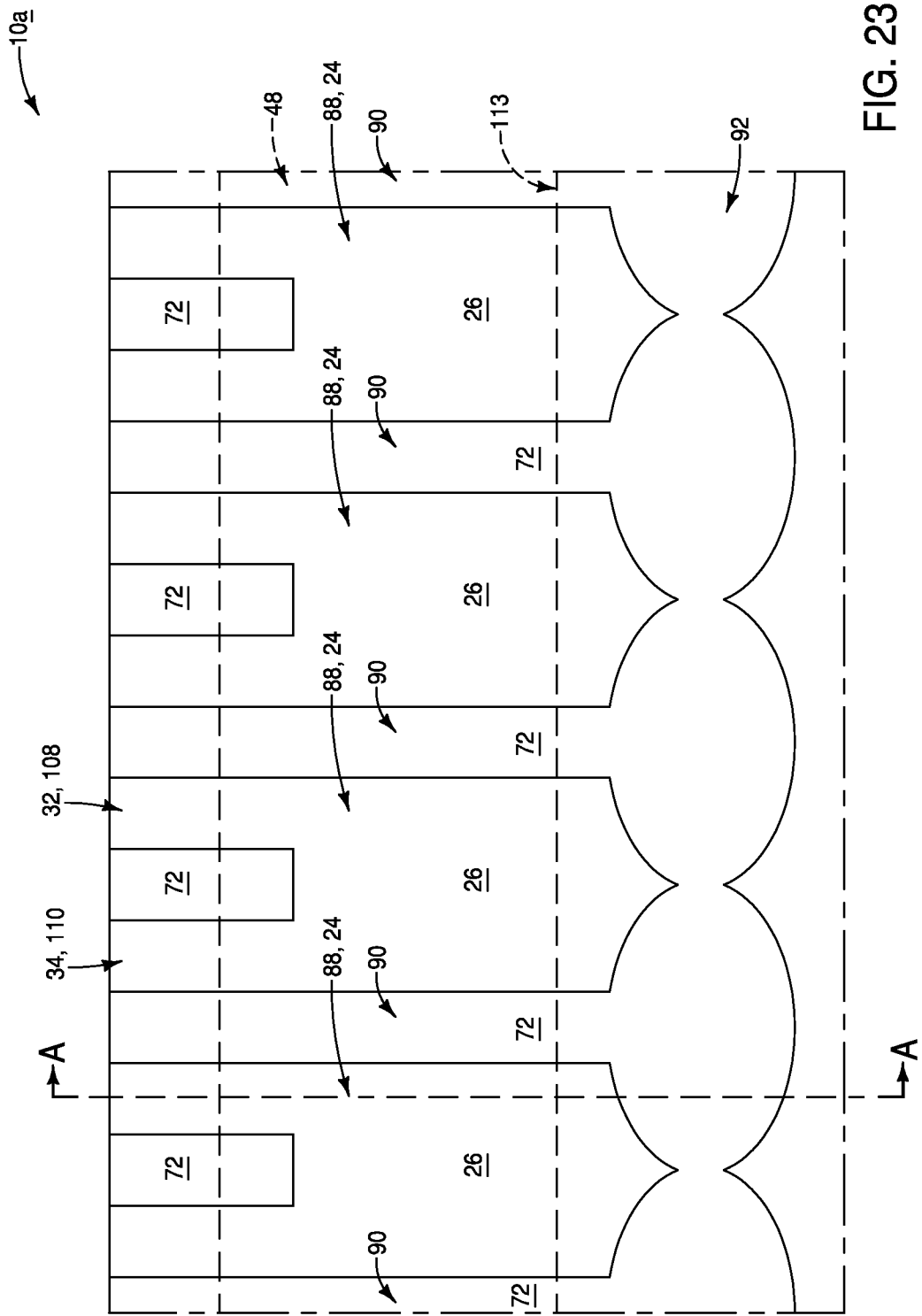

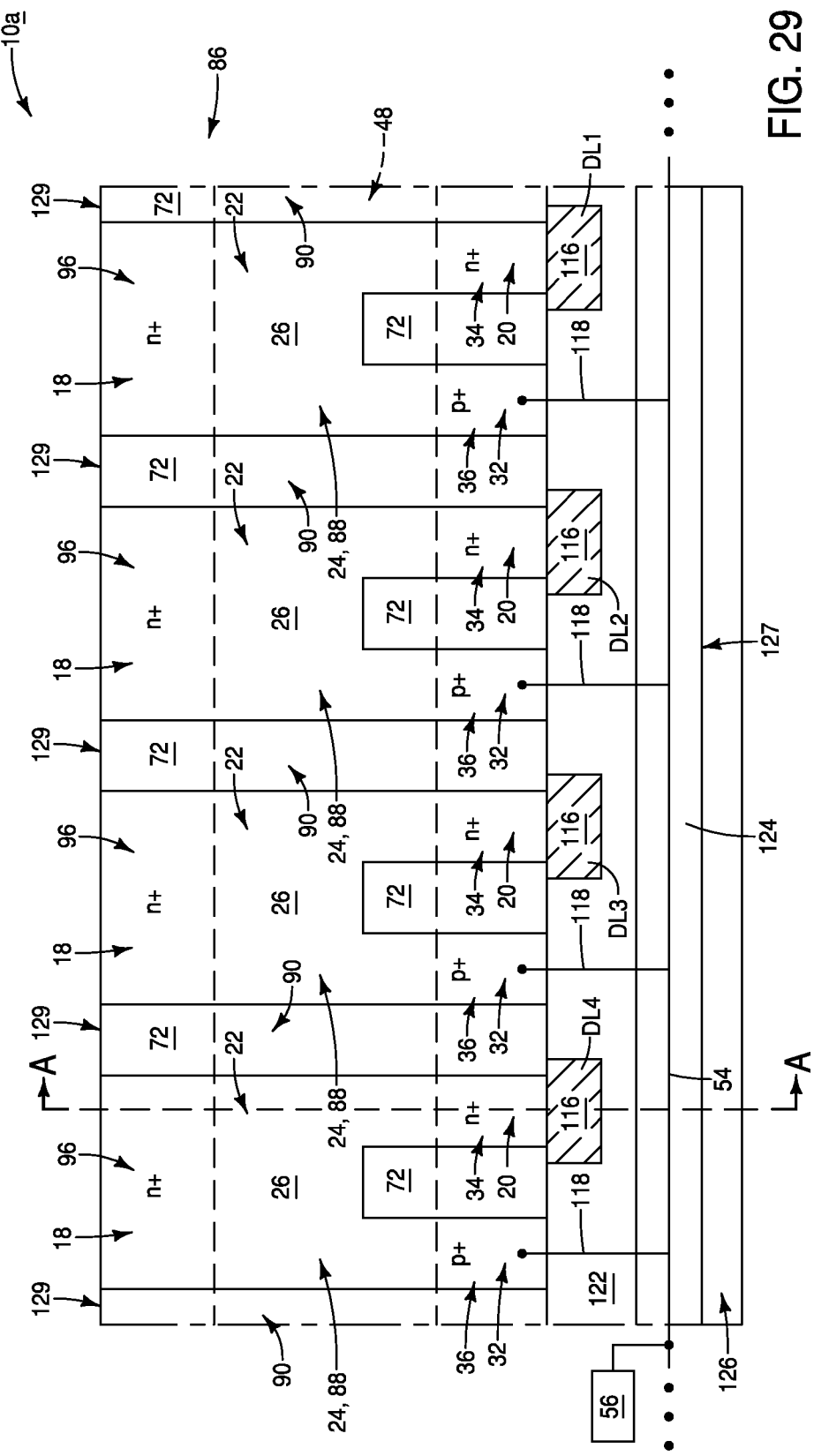

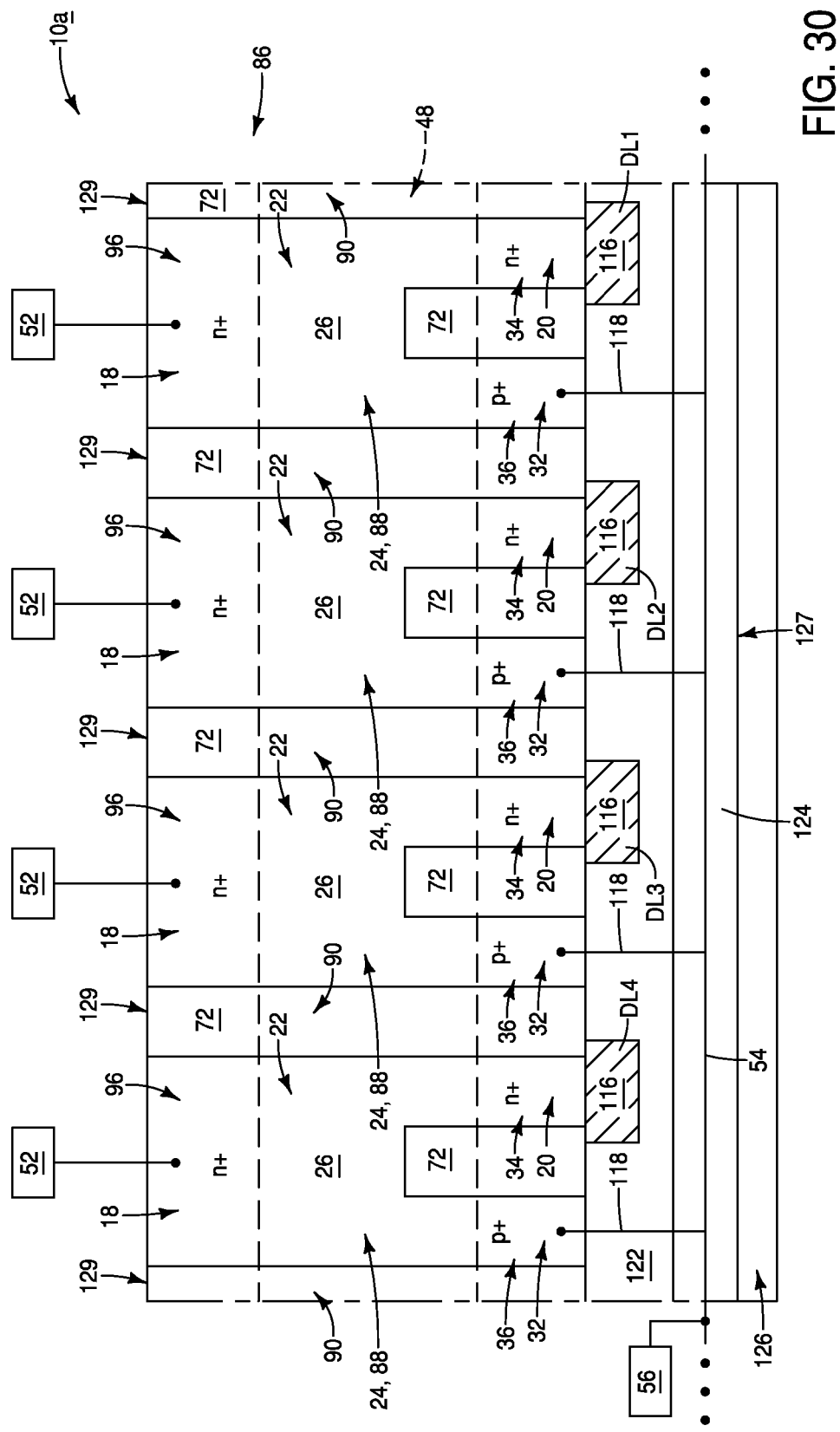

INTEGRATED ASSEMBLIES HAVING BODY CONTACT REGIONS PROXIMATE TRANSISTOR BODY REGIONS; AND METHODS UTILIZING BOWL ETCHES DURING FABRICATION OF INTEGRATED ASSEMBLIES

RELATED PATENT DATA

This patent resulted from a divisional of U.S. patent application Ser. No. 16/213,172, filed Dec. 7, 2018, the disclosures of which are hereby incorporated herein by reference.

TECHNICAL FIELD

Integrated assemblies having body contact regions proximate transistor body regions; and methods utilizing bowl etches during fabrication of integrated assemblies.

BACKGROUND

Memory is utilized in modern computing architectures for storing data. One type of memory is Dynamic Random-Access Memory (DRAM). DRAM may provide advantages of structural simplicity, low cost and high speed in comparison to alternative types of memory.

DRAM may utilize memory cells which have one capacitor in combination with one transistor (so-called 1T-1C memory cells), with the capacitor being coupled with a source/drain region of the transistor. The transistor may be referred to as an access transistor.

An example 1T-1C memory cell 2 is shown in FIG. 1, with the transistor labeled T and the capacitor labeled C. The capacitor has one node coupled with a source/drain region of the transistor, and has another node coupled with a common plate, CP. The common plate may be coupled with any suitable voltage, such as a voltage within a range of from greater than or equal to ground to less than or equal to VCC (i.e., ground≤CP≤VCC). In some applications, the common plate is at a voltage of about one-half VCC (i.e., about VCC/2). The transistor has a gate coupled to a wordline WL (i.e., access line), and has a source/drain region coupled to a bitline BL (i.e., digit line or sense line). In operation, an electric field generated by voltage along the wordline may gatedly couple the bitline to the capacitor during read/write operations.

Another prior art 1T-1C memory cell configuration is shown in FIG. 2. The configuration of FIG. 2 shows two memory cells 2a and 2b; with the memory cell 2a comprising a transistor T1 and a capacitor C1, and with the memory cell 2b comprising a transistor T2 and a capacitor C2. Wordlines WL0 and WL1 are electrically coupled with the gates of transistors T1 and T2, respectively. A connection to a bitline BL is shared by the memory cells 2a and 2b.

The memory cells described above may be incorporated into memory arrays, and in some applications the memory arrays may have open bitline arrangements. An example integrated assembly 9 having open bitline architecture is shown in FIG. 3. The assembly 9 includes two laterally adjacent memory arrays ("Array 1" and "Array 2"), with each of the arrays including memory cells of the type described in FIG. 2 (not labeled in FIG. 3 in order to simplify the drawing). Wordlines WL0-WL7 extend across the arrays, and are coupled with wordline drivers. Digit lines D0-D8 are associated with the first array (Array 1), and digit lines D0*-D8* are associated with the second array (Array 2). Sense amplifiers SA0-SA8 are provided between the first and second arrays. Digit lines at the same height are paired within one another and compared through a sense amplifier (e.g., digit lines D0 and D0* are paired with one another and compared with the sense amplifier SA0). In a read operation, one of the paired digit lines may serve as a reference in determining electrical properties (e.g., voltage) of the other of the paired digit lines.

In some applications, the access transistors may be vertical devices, and may comprise a channel region vertically between a pair of source/drain regions. Such vertical devices may advantageously occupy a smaller footprint as compared to other configurations (e.g., planar transistor devices), which may enable tighter packing and higher levels of integration. Floating body effects may problematically occur with vertical access transistors; as described in U.S. Pat. No. 8,878,271, with Kamal M. Karda as the first inventor, and which is assigned to Micron Technology, Inc. The floating body effects result from the channel region of a vertical access transistor being within a body of semiconductor material which is not electrically coupled with a reference voltage (i.e., which "floats" rather than being set to a specific reference voltage). The floating body effects may lead to degraded charge retention, power distribution problems, and/or other problems across a memory array.

It would be desirable to develop architectures which alleviate floating body effects associated with vertical access devices, and to develop methods for fabricating such architectures. It would be further desirable for the methods to be suitable for other applications in addition to the fabrication of access devices.

BRIEF DESCRIPTION OF THE DRAWINGS

FIG. 4A is a view along the line A-A of FIG. 4.

FIGS. 6-30 are diagrammatic cross-sectional views of a region of an example integrated assembly at example process stages of an example method.

DETAILED DESCRIPTION OF THE ILLUSTRATED EMBODIMENTS

Figure 1:
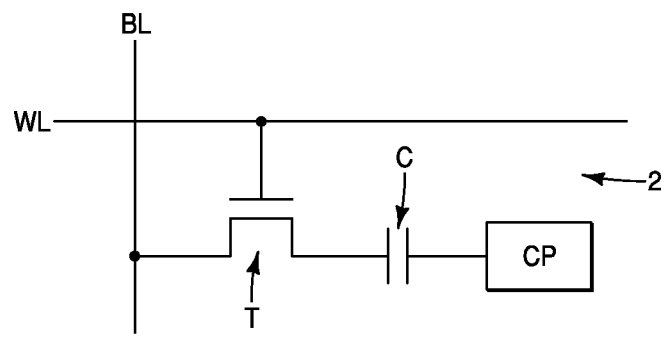
FIG. 1 is a schematic diagram of a prior art memory cell having 1 transistor and 1 capacitor.
Figure 2:
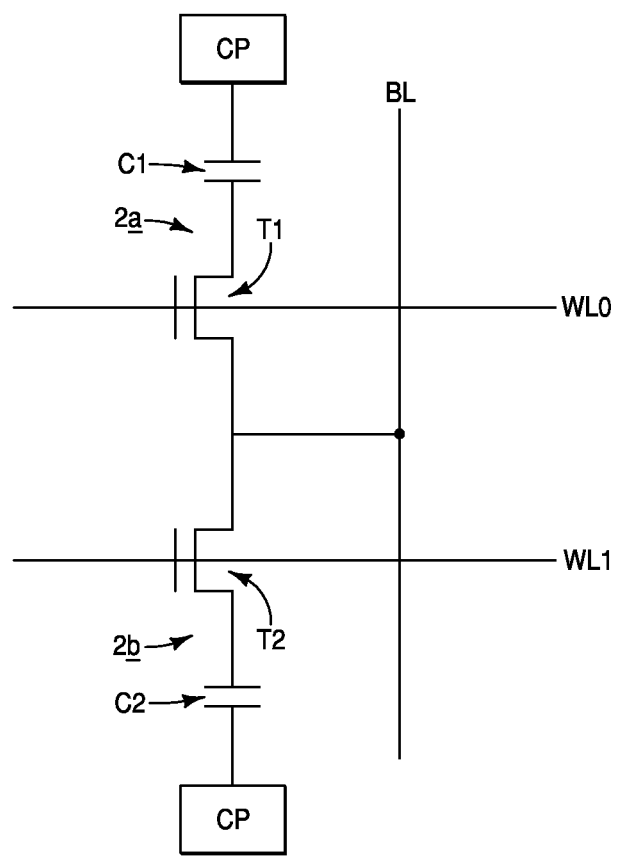
FIG. 2 is a schematic diagram of a pair of prior art memory cells which each have 1 transistor and 1 capacitor, and which share a bitline connection.

Some embodiments include integrated assemblies having transistor body regions with first and second source/drain regions. The first and second source/drain regions may be vertically-displaced relative to one another. A body contact region may be adjacent to one of the first and second source/drain regions; with a portion of the body contact region being laterally-spaced from the adjacent source/drain region by an intervening insulative region. Some embodiments include methods of forming integrated assemblies. The methods may include formation of trenches into a mass of semiconductor material, and formation of bowl regions along bottoms of the trenches. Neighboring bowl regions may overlap one another. The bowl regions and trenches may be filled with insulative material to form insulative posts within the trenches and to form an insulative layer (or floor) from the insulative material in the bowl regions. The insulative posts may extend upwardly from the insulative floor. Example embodiments are described with reference to FIGS. 4-30.

As a preliminary matter, it is noted that some of the figures show various different dopant levels, and utilize some or all of the designations p+, p, p−, n−, n and n+ to distinguish the levels. The difference in dopant concentration between the regions identified as being p+, p, and p− are typically as follows. A p+ region has a dopant concentration of at least about $10^{20}$ atoms/cm$^3$, a p region has a dopant concentration of from about $10^{14}$ to about $10^{18}$ atoms/cm$^3$, and a p− region has a dopant concentration in the order of or less than $10^{16}$ atoms/cm$^3$. It is noted that regions identified as being n−, n and n+ will have dopant concentrations similar to those described above relative to the p−, p and p+ regions respectively, except, of course, the n regions will have an opposite-type conductivity-enhancing dopant therein than do the p regions. It is noted that the terms "p" and "n" can be utilized herein to refer to both dopant type and relative dopant concentrations. The terms "p" and "n" are to be understood as referring only to dopant type, and not to a relative dopant concentration, except when it is explicitly stated that the terms refer to relative dopant concentrations. Accordingly, for purposes of interpreting this disclosure and the claims that follow, it is to be understood that the term "p-type doped" and "n-type doped" refer to dopant types of a region and not to relative dopant levels. Thus, a p-type doped region can be doped to any of the p+, p, and p− dopant levels discussed above, and similarly an n-type doped region can be doped to any of the n+, n, and n− dopant levels discussed above. In some embodiments, n-type may be considered to be an opposite conductivity type relative to p-type.

As another preliminary matter, it is noted that the transistors described herein may be referred to as PMOS devices, NMOS devices, p-channel devices and n-channel devices. PMOS transistors may have n-type doped channel (i.e., body) regions when resting; but, in accordance with generally-accepted parlance, are referred to as p-channel devices due to the channels being operated to conduct holes between p-type source/drain regions. Similarly, NMOS transistors may have p-type doped channel (i.e., body) regions when resting, but, in accordance with generally-accepted parlance, are referred to as n-channel devices due to the channels being operated to conduct electrons between n-type source/drain regions. It is noted that the body regions may be intrinsically doped (or effectively undoped) when resting, rather than being either n-type doped or p-type doped when resting.

Figure 4:
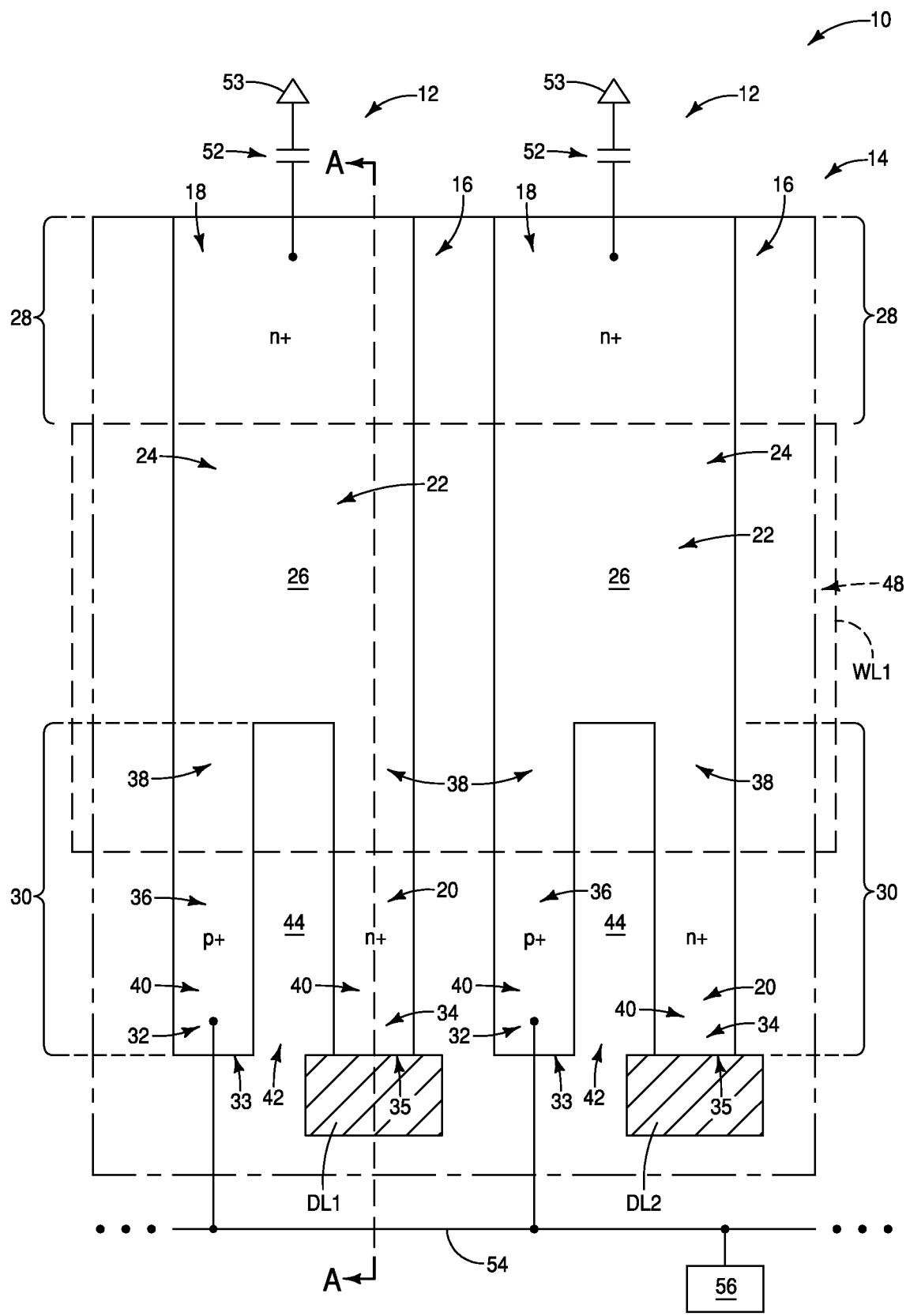
FIGS. 4 and 4A are diagrammatic cross-sectional views of a region of an example integrated assembly.
Figure 4A:
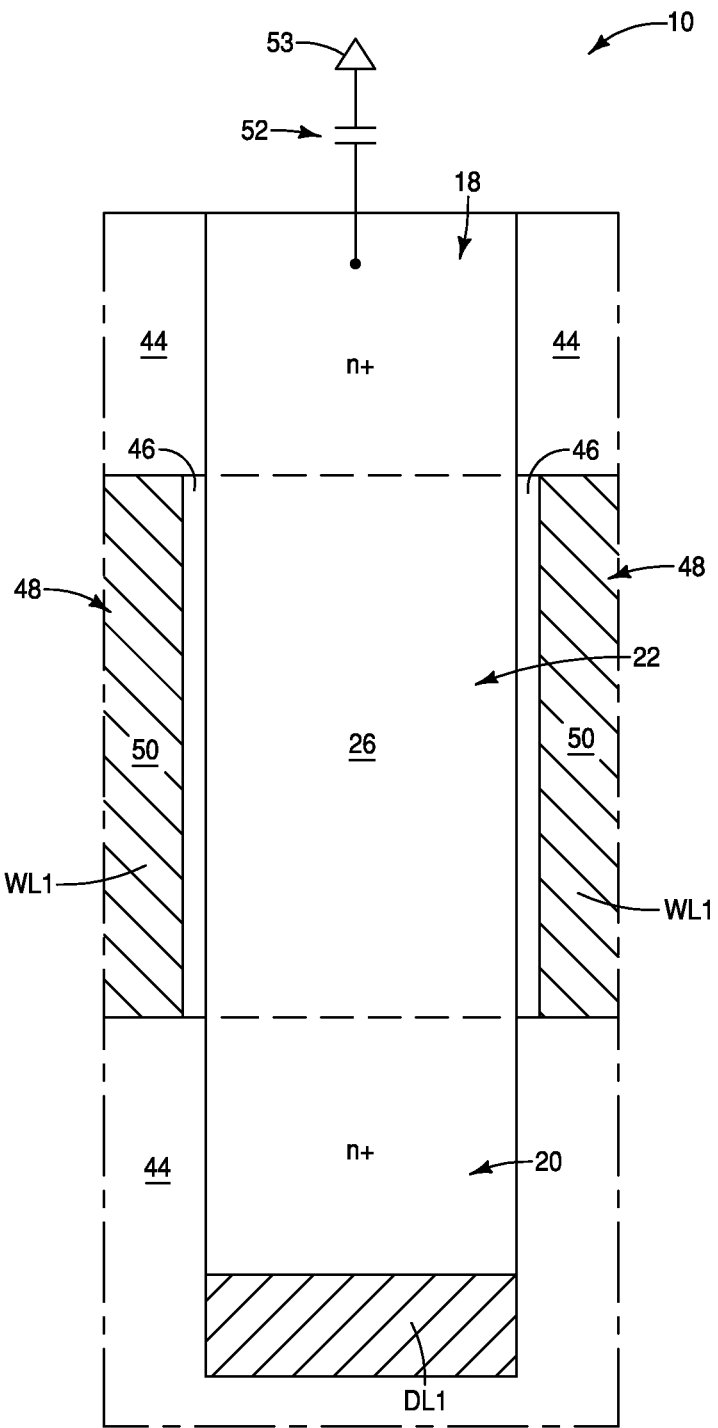

Referring to FIGS. 4 and 4A, a region of an integrated assembly 10 is shown to comprise memory structures (i.e., cells) 12 of a memory array 14. Each of the memory structures 12 includes a transistor 16 having source/drain regions 18 and 20. The source/drain regions 18 and 20 are vertically displaced relative to one another, and are separated by a body region (i.e., channel region) 22.

The source/drain regions 18 and 20, and the body regions 22, are within semiconductor structures 24. The semiconductor structures 24 comprise semiconductor material 26. The semiconductor material 26 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 26 may comprise, consist essentially of, or consist of silicon. Such silicon may be in any suitable form, and in some embodiments may be monocrystalline.

In some embodiments, the source/drain regions 18 may be considered to be within upper regions 28 of the semiconductor structures 24, and the source/drain regions 20 may be considered to be within lower regions 30 of the semiconductor structures. The body regions 22 may be considered to be vertically between the upper and lower regions 28 and 30.

The lower regions 30 are split into two legs 32 and 34. The legs 32 may be referred to as first legs, and the legs 34 may be referred to as second legs. The first legs comprise body contact regions 36 which are doped to an opposite conductivity type as compared to the source/drain regions 18 and 20. In the shown embodiment, the body contact regions are p-type doped, and the source/drain regions 18 and 20 are n-type doped so that the transistors 16 are n-channel devices. In other embodiments, the doping could be reversed so that the source/drain regions are p-type doped and the body contact regions are n-type doped; and accordingly the transistors 16 could be p-channel channel devices.

The first and second legs 32 and 34 both join to the body region 22. In the shown embodiment, the first and second legs 32 and 34 have planarized bottom surfaces 33 and 35, respectively; and such surfaces are coplanar with one another.

The first and second legs 32 and 34 may be considered to have top regions 38 which join with the body regions 22, and to have bottom regions 40 which are vertically offset from the top regions 38. In the illustrated embodiment, the bottom regions 40 of the first legs 32 are laterally offset (laterally spaced) from the bottom regions 40 of the second legs 34 by intervening regions 42 comprising insulative material 44. In some embodiments, the insulative material 44 may comprise, consist essentially of, or consist of silicon dioxide.

In the shown embodiment, an insulative material 46 (FIG. 4A) is adjacent to the body regions 22. The insulative material 46 may be referred to as gate dielectric material, and may comprise any suitable composition(s); such as, for example, one or more of silicon dioxide and any of various high-k materials (e.g., aluminum oxide, hafnium oxide, etc.), where the term "high-k" means a dielectric constant greater than that of silicon oxide.

A conductive gate 48 (FIG. 4A) is adjacent to the insulative material 46, and is spaced from the body region 22 by the insulative material 46. The conductive gate 48 comprises conductive material 50. Such conductive material may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 50 may comprise one or both of titanium nitride and tungsten.

The conductive gate 48 is diagrammatically illustrated in FIG. 4 utilizing a dashed-line (phantom) view to indicate that the gate is out of the plane relative to the cross-section of FIG. 4.

Charge-storage devices 52 are coupled with the upper (first) source/drain regions 18. The charge-storage devices are illustrated to be capacitors, but in other embodiments may be any suitable configurations which reversibly store charge; including, for example, phase-change memory devices, conductive-bridging memory devices, resistive memory devices, etc. The memory cells 12 may be considered to comprise the access transistors 16 in combination with the charge-storage devices 52.

Each of the illustrated capacitors 52 has a first plate coupled to one of the source/drain regions 18, and has a second plate coupled to a reference voltage 53. The reference voltage 53 may be any suitable reference voltage; such as, for example, ground and/or common plate voltage.

Wordlines and digit lines extend across the memory array 14. An example wordline WL1 is shown to be coupled with the conductive gate 48. Example digit lines DL1 and DL2 are shown to be coupled with the lower (second) source/drain regions 20.

In the shown embodiment, the body contact regions 36 of the transistors 16 are coupled with wiring 54 which in turn is coupled with a reference voltage 56. The reference voltage 56 may be any suitable reference voltage; and in some embodiments may include ground voltage and/or common plate voltage. The reference voltage 56 may be utilized to replenish carrier within the body regions 22 of the transistors, and may thereby alleviate or prevent the problematic floating body effects described in the Background section of this disclosure.

Figure 5:
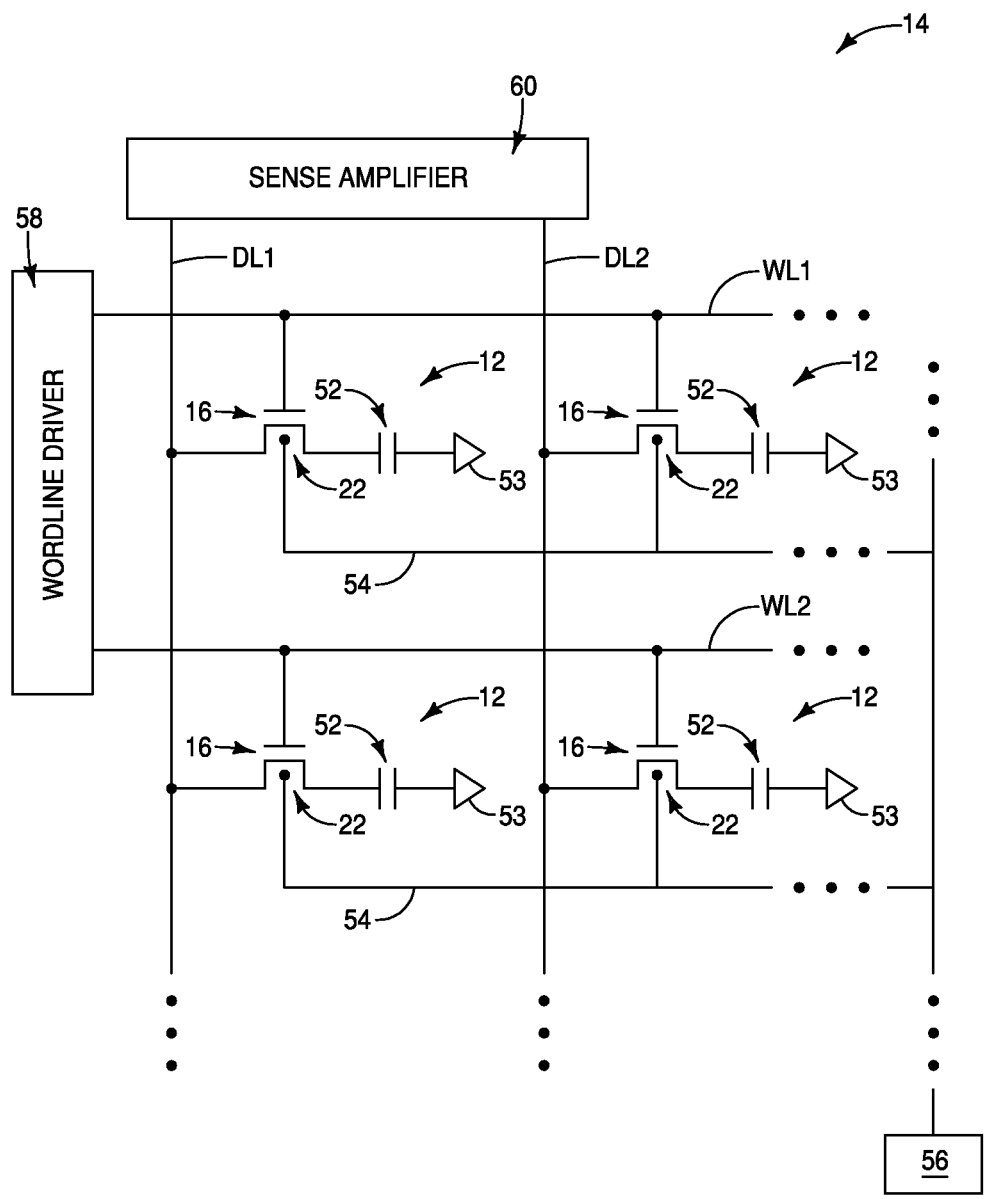
FIG. 5 is a schematic diagram of region of an example memory array.

In some embodiments, the illustrated memory cells 12 may be representative of a large number of substantially identical memory cells across a memory array (with the term "substantially identical" meaning identical to within reasonable tolerances of fabrication and measurement). FIG. 5 schematically illustrates a region of an example memory array 14. The memory array includes a plurality of memory cells 12. Each memory cell includes an access transistor 16 and a capacitor 52. Body regions 22 of the transistors 16 are coupled with wiring 54 which extends to the reference voltage 56.

Figure 3:
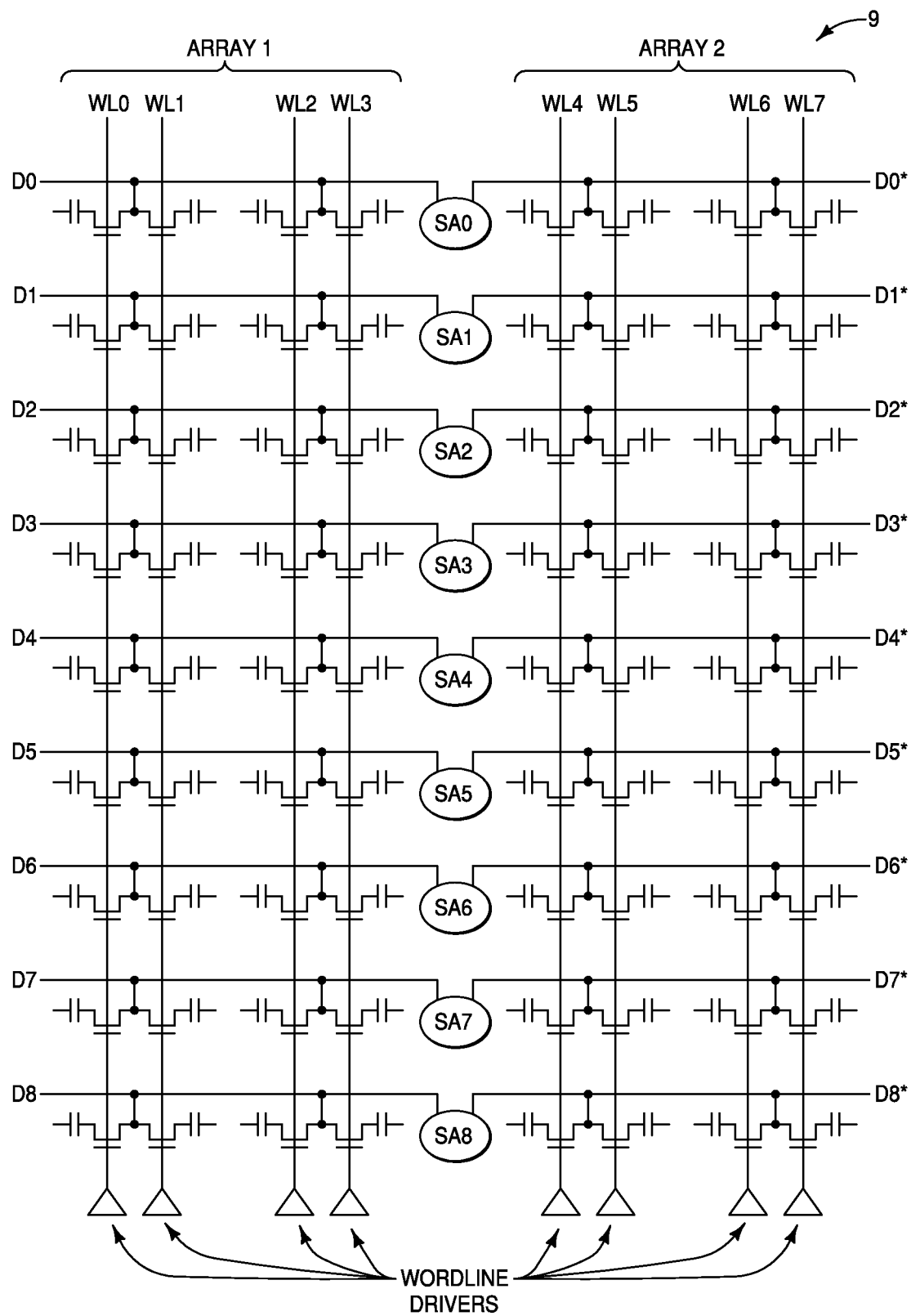
FIG. 3 is a schematic diagram of a prior art integrated assembly having open bitline architecture.

The illustrated region of the memory array 14 includes a pair of wordlines WL1 and WL2 which extend to wordline driver circuitry 58; and includes the digit lines DL1 and DL2 which extend to the sense amplifier circuitry 60. Each of the memory cells is uniquely addressed by one of the wordlines in combination with one of the digit lines. In some embodiments, the memory array 14 of FIG. 5 may be incorporated into an open bitline architecture analogous to that described above with reference to FIG. 3.

The memory cells 12 may be fabricated utilizing any suitable processing. Example processing is described with reference to FIGS. 6-30 relative to formation of an integrated assembly 10*a*.

Figure 6A:
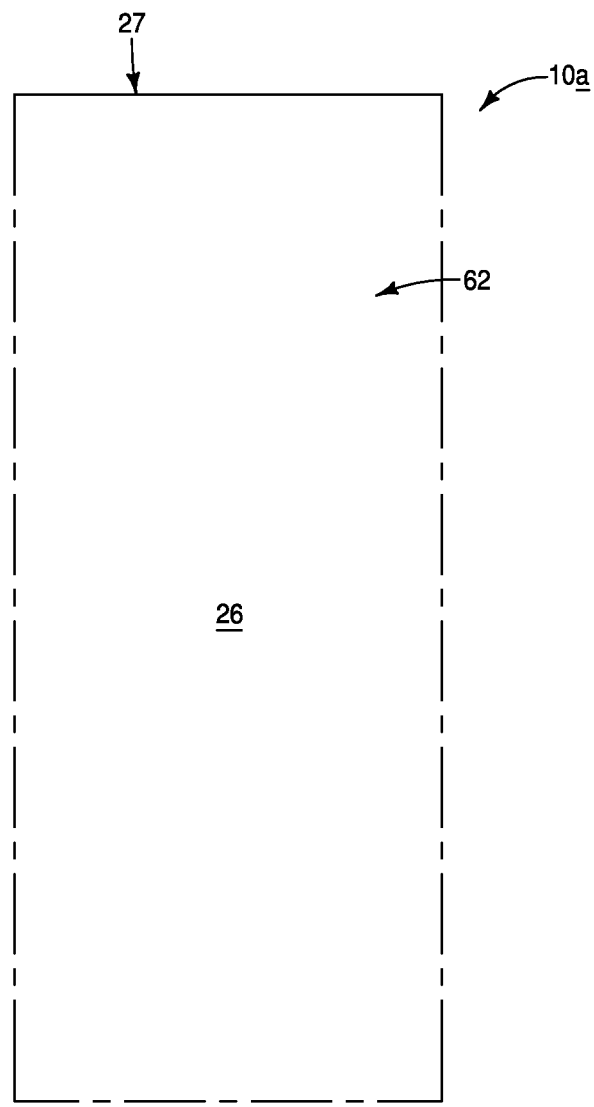
FIGS. 6A, 20A, 21A, 22A, 23A, 28A and 29A are diagrammatic cross-sectional views along the line A-A of FIGS. 6, 20, 21, 22, 23, 28 and 29, respectively.

Referring to FIGS. 6 and 6A, a mass 62 of the semiconductor material 26 is provided. In some embodiments, the mass 62 may be referred to as a base, a substrate or a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. As discussed previously, in some embodiments the semiconductor material 26 may comprise, consist essentially of, or consist of monocrystalline silicon.

The semiconductor material 26 has an upper surface 27. Such upper surface may be substantially planar (as shown); with the term "substantially planar" meaning planar to within reasonable tolerances of fabrication and measurement.

Figure 7:
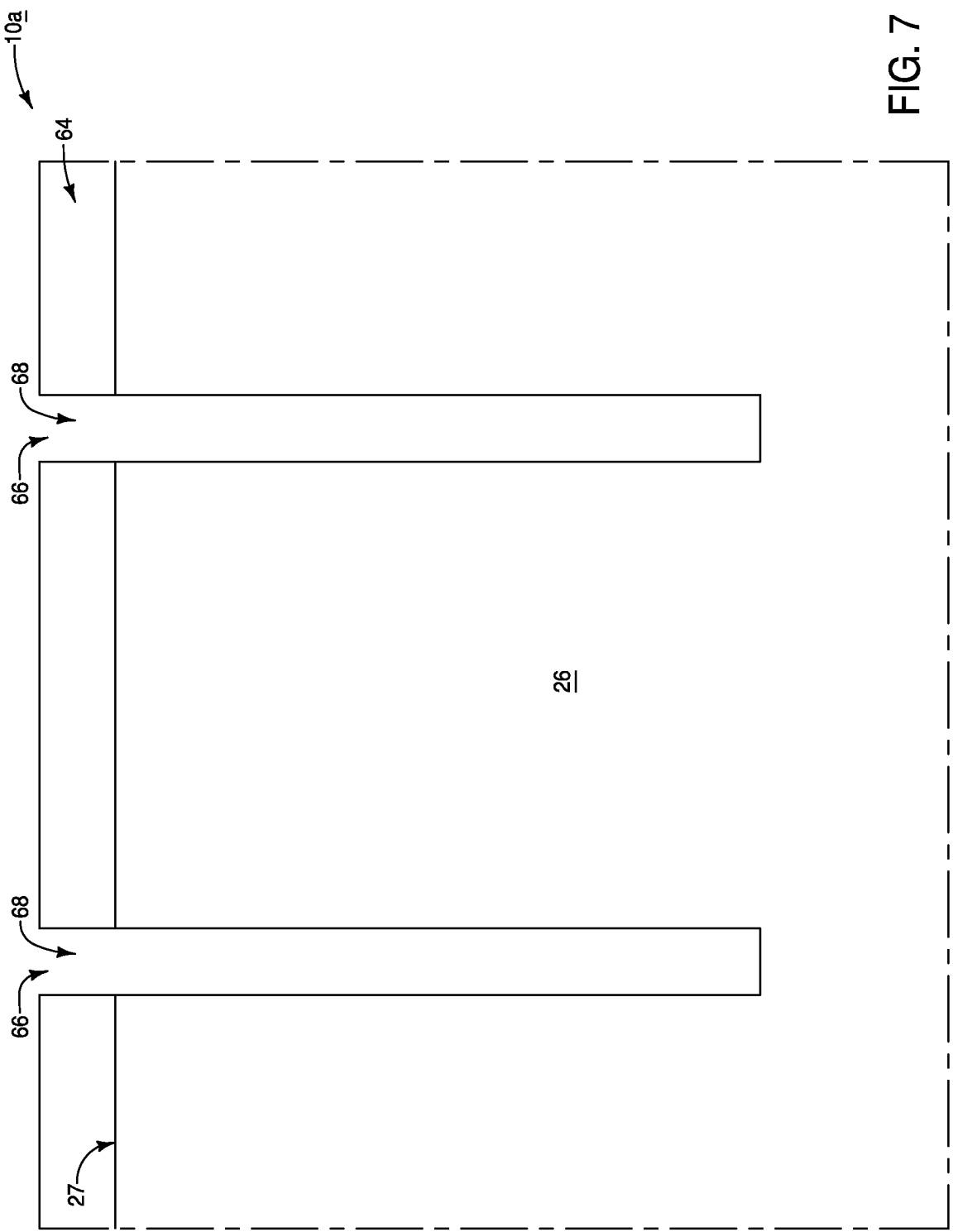

Referring to FIG. 7, a patterned mask 64 is formed over the semiconductor material 26. The patterned mask has openings 66 extending therethrough. The openings 66 are provided in locations where it is desired to form trenches extending into the semiconductor material 26. In subsequent processing, the openings 66 are extended into the semiconductor material 26 to form the trenches 68 within the semiconductor material 26. In some embodiments, the trenches 68 may be referred to as first trenches to distinguish them from other trenches formed at subsequent process steps. The trenches 68 may extend in and out of the page relative to the cross-sectional view of FIG. 7. The trenches 68 are laterally spaced from one another along the cross-section of FIG. 7.

The patterned mask 64 may comprise any suitable masking materials; including, for example, photolithographically-patterned photoresist and/or various hard-mask materials (e.g., silicon nitride, amorphous carbon, etc.). In some embodiments, the patterned mask 64 may be referred to as a first patterned mask to distinguish it from other patterned masks formed at subsequent process steps.

The trenches 68 may be extended into the semiconductor material 26 with any suitable anisotropic etch.

Figure 8:
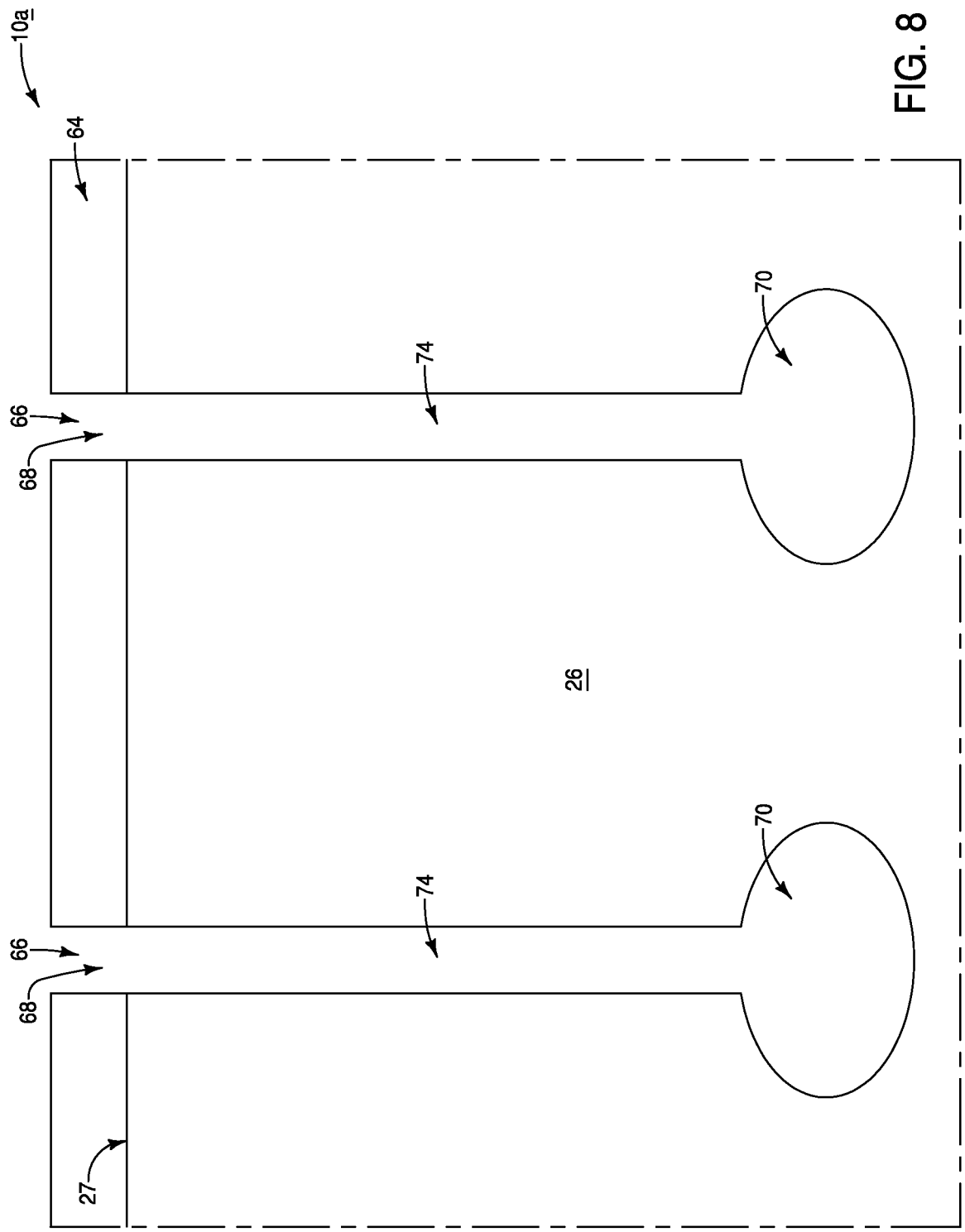

Referring to FIG. 8, isotropic etching is utilized to widen lower portions (i.e., bottom regions) of the trenches 68 to form bowl regions 70 along such lower portions. The bowl regions 70 may be referred to as first bowl regions to distinguish them from other bowl regions formed at subsequent processing steps. Upper portions of the first trenches 68 may be protected with liners (not shown) during the formation of the bowl regions 70. In some embodiments, the trenches 68 and attached bowl regions 70 may be formed with processing analogous that described in U.S. Patent Publication 2006/0292787.

Figure 9:
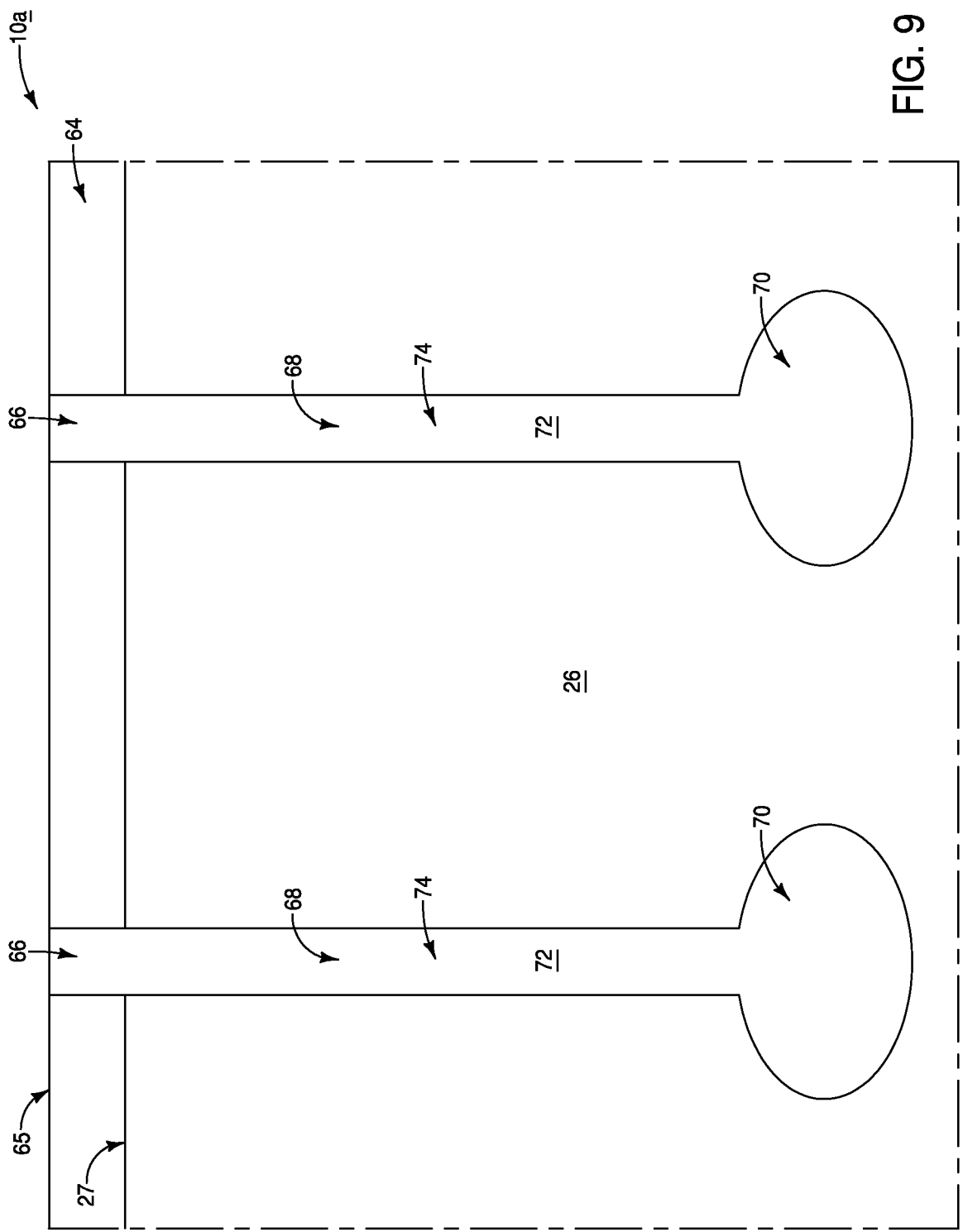

Referring to FIG. 9, the first trenches 68 and first bowl regions 70 are filled with insulative material 72. The first patterned mask 64 remains over the semiconductor material 26 as the insulative material 72 is formed within the trenches 68 and bowl regions 70; and accordingly the insulative material 72 also fills the openings 66 within the mask 64. A planarized surface 65 is shown extending across the insulative material 72 and the patterned mask 64. In some embodiments, the insulative material 72 may be initially formed to overfill the trenches 68 and openings 66, and then planarization (e.g., chemical-mechanical polishing (CMP)) may be utilized to remove excess insulative material 72 and form the planarized surface 65.

The insulative material 72 may comprise any suitable composition(s); and in some embodiments may comprise, consist essentially of, or consist of silicon dioxide.

In some embodiments, the insulative material 72 within the trenches 68 at the processing stage of FIG. 9 may be considered to be configured as insulative pillars 74 having regions which extend upwardly past the upper surface 27 of the semiconductor material 26 and into the first patterned mask 64.

Figure 10:
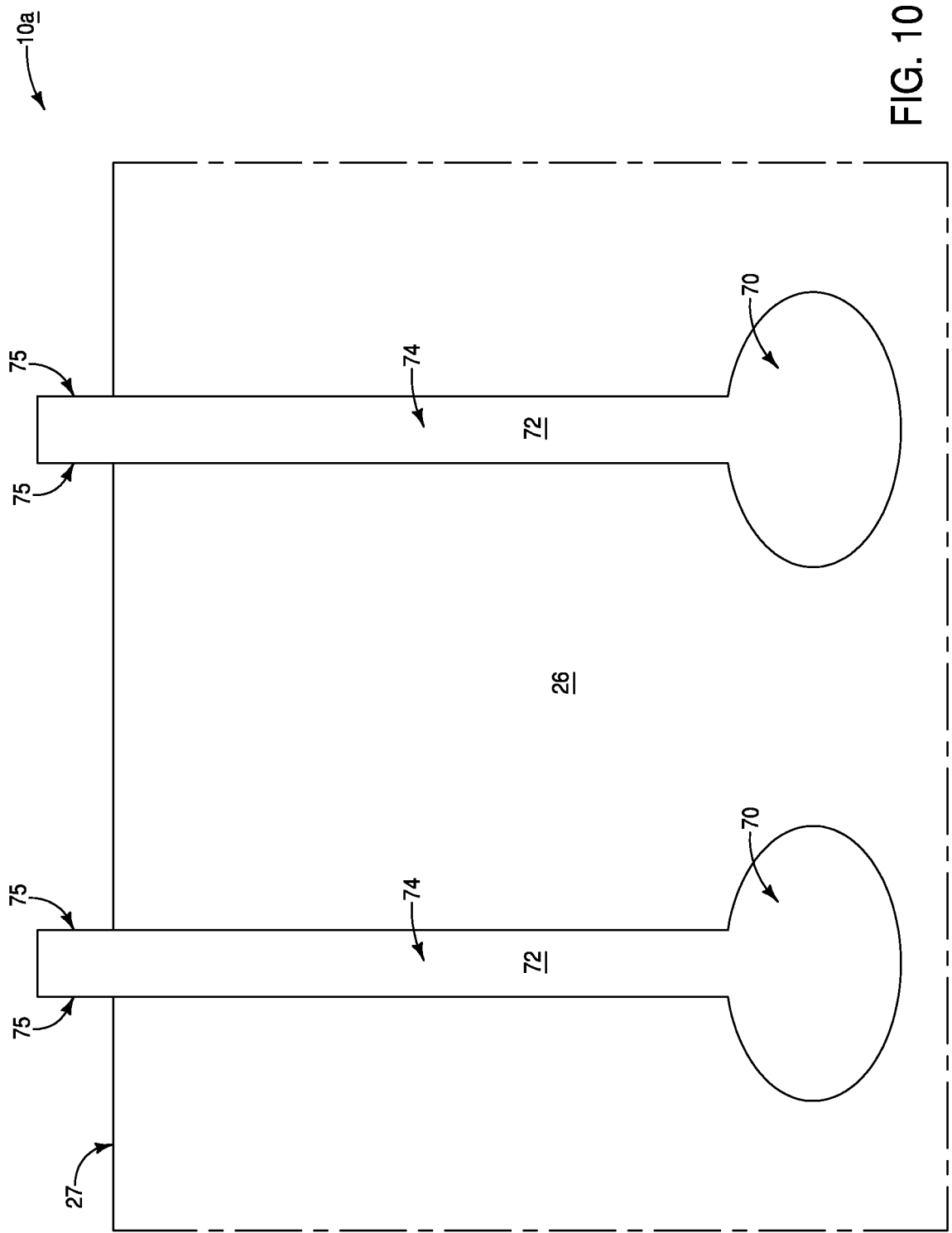

Referring to FIG. 10, the mask 64 (FIG. 9) is removed to expose sidewalls 75 of the pillars 74.

Figure 11:
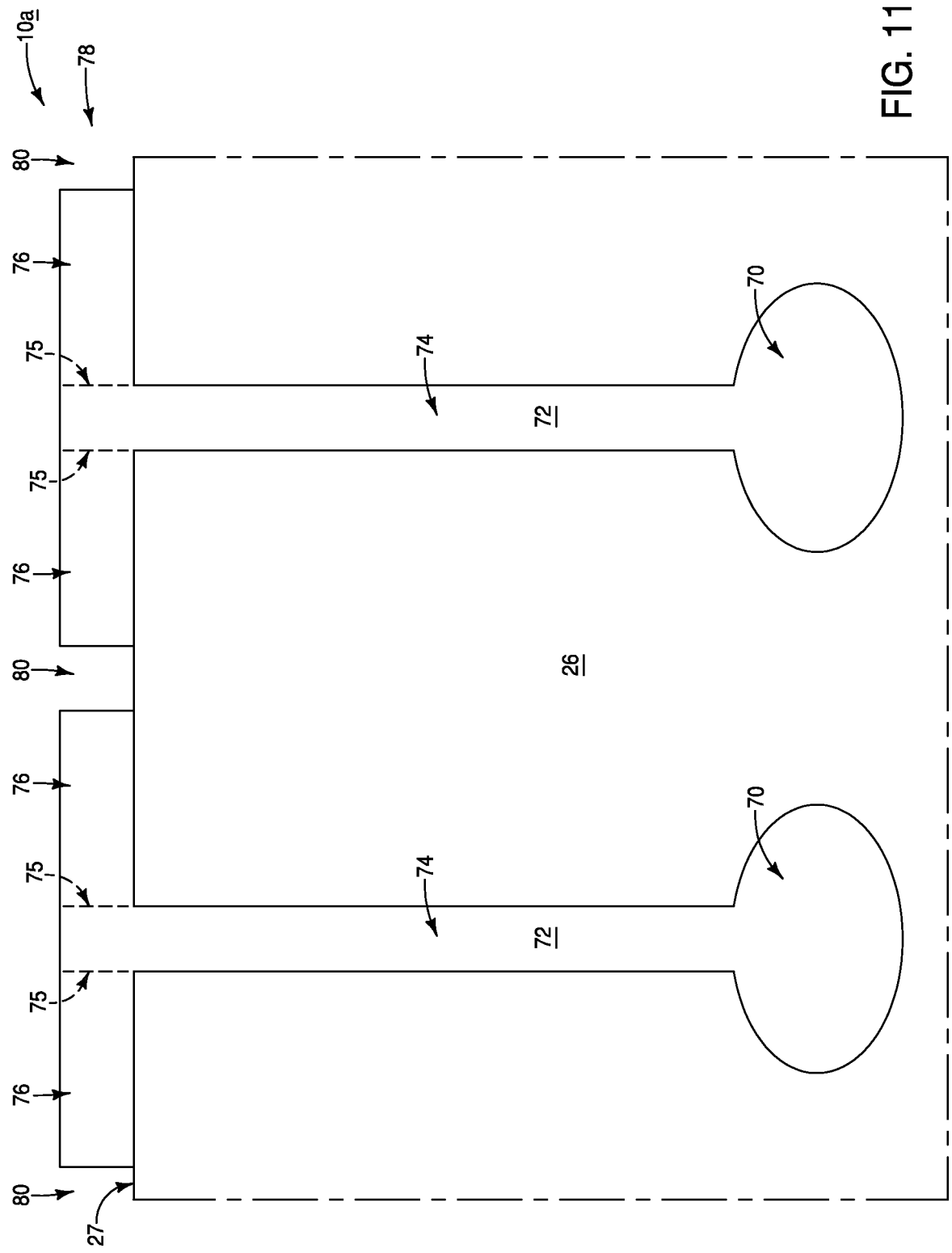

Referring to FIG. 11, spacers 76 are formed along the sidewalls 75 of the pillars 74. The spacers may comprise any suitable material, and in some embodiments may comprise the same insulative material 72 (e.g., silicon dioxide) as the pillars 74. The spacers may be formed with any suitable processing. For instance, spacer material may be formed over the upper surface 27 of the semiconductor material 26 and over the pillars 74, and may then be subjected to anisotropic etching to form the illustrated spacers 76.

The spacers 76 form a second patterned mask 78 having openings 80 extending therethrough.

Figure 12:
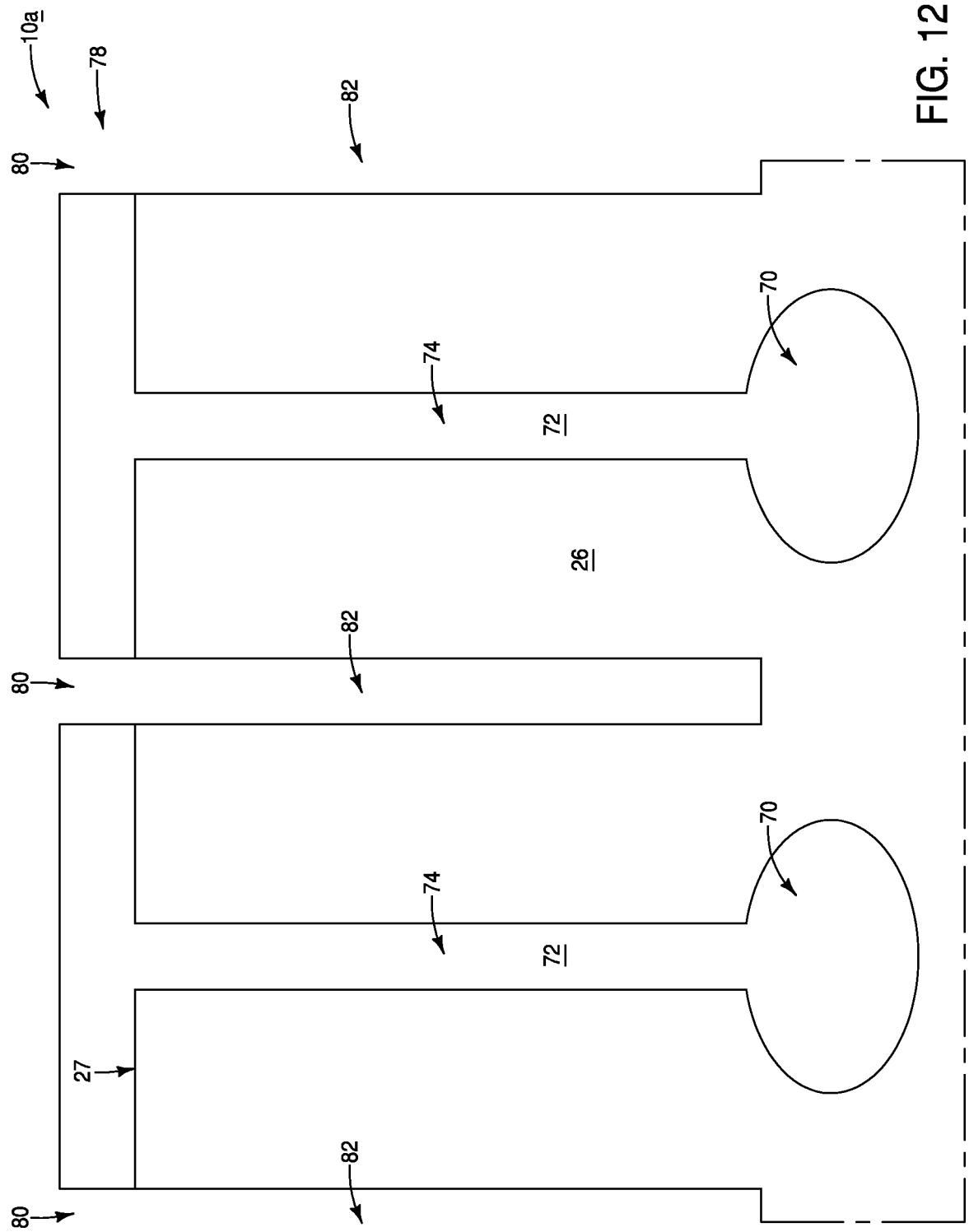

Referring to FIG. 12, the semiconductor material 26 is etched through the openings 80 to form second trenches 82. In some embodiments, the openings 80 of the second mask 78 may be considered to define locations for the second trenches 82.

Figure 13:
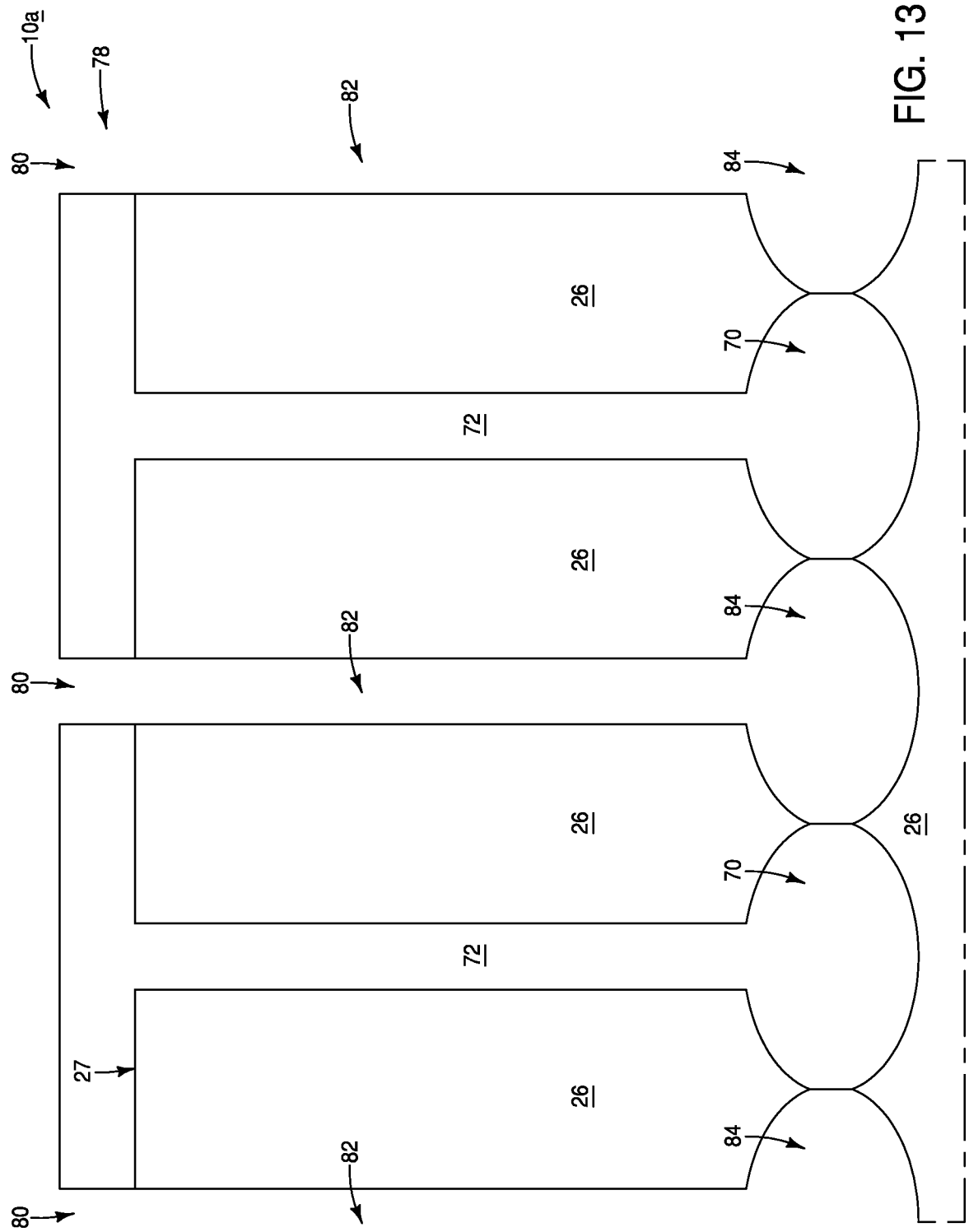

Referring to FIG. 13, isotropic etching is utilized to widen lower portions (i.e., bottom regions) of the second trenches 82 and thereby form second bowl regions 84 along such lower portions. In some embodiments, the trenches 82 and attached bowl regions 84 may be formed with processing analogous that described in U.S. Patent Publication 2006/0292787.

The second bowl regions 84 are formed between the first bowl regions 70. The first and second bowl regions 70 and 84 merge with one another.

Figure 14:
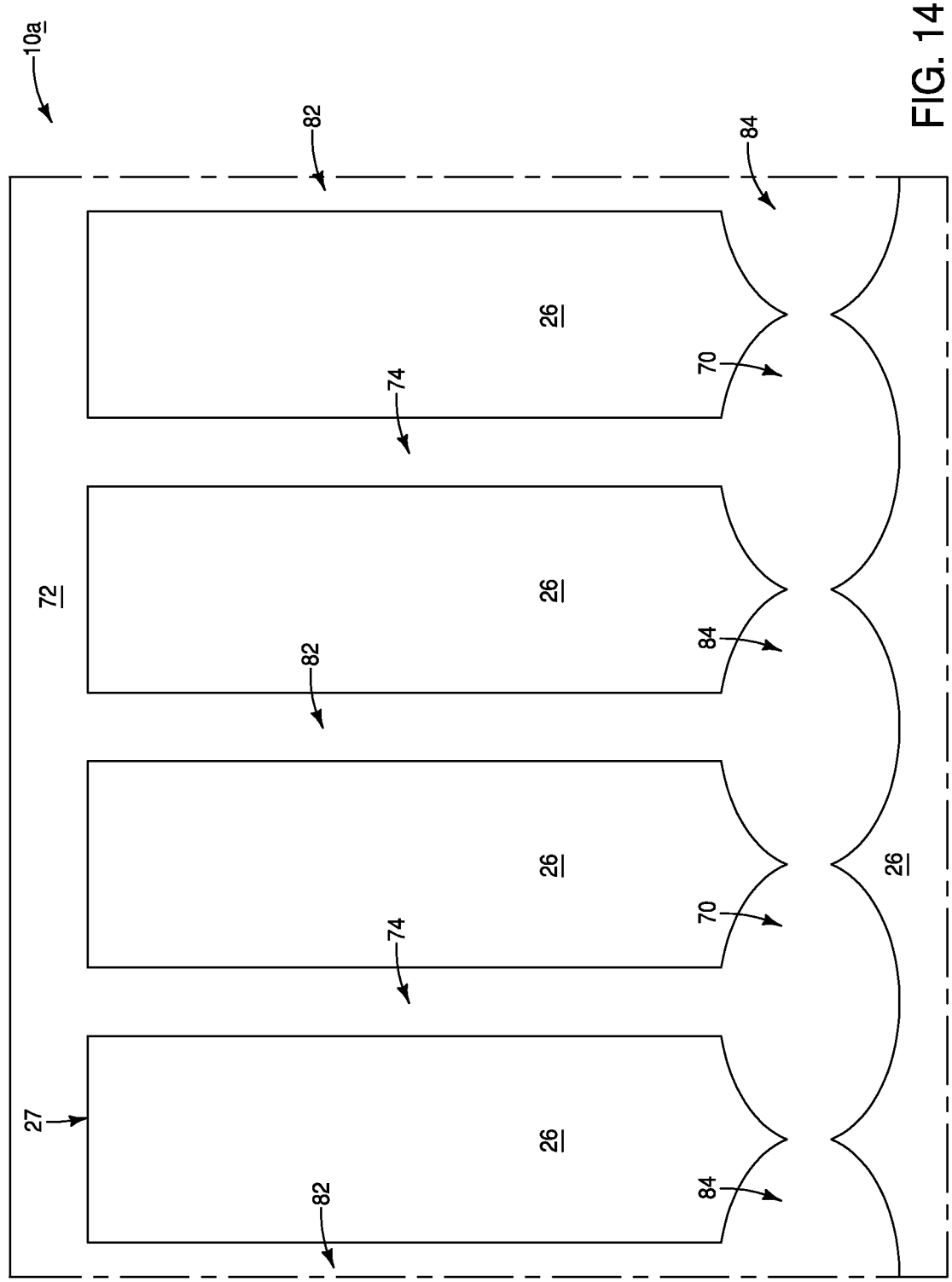

Referring to FIG. 14, the second trenches 82 and second bowl regions 84 are filled with the insulative material 72.

Figure 15:
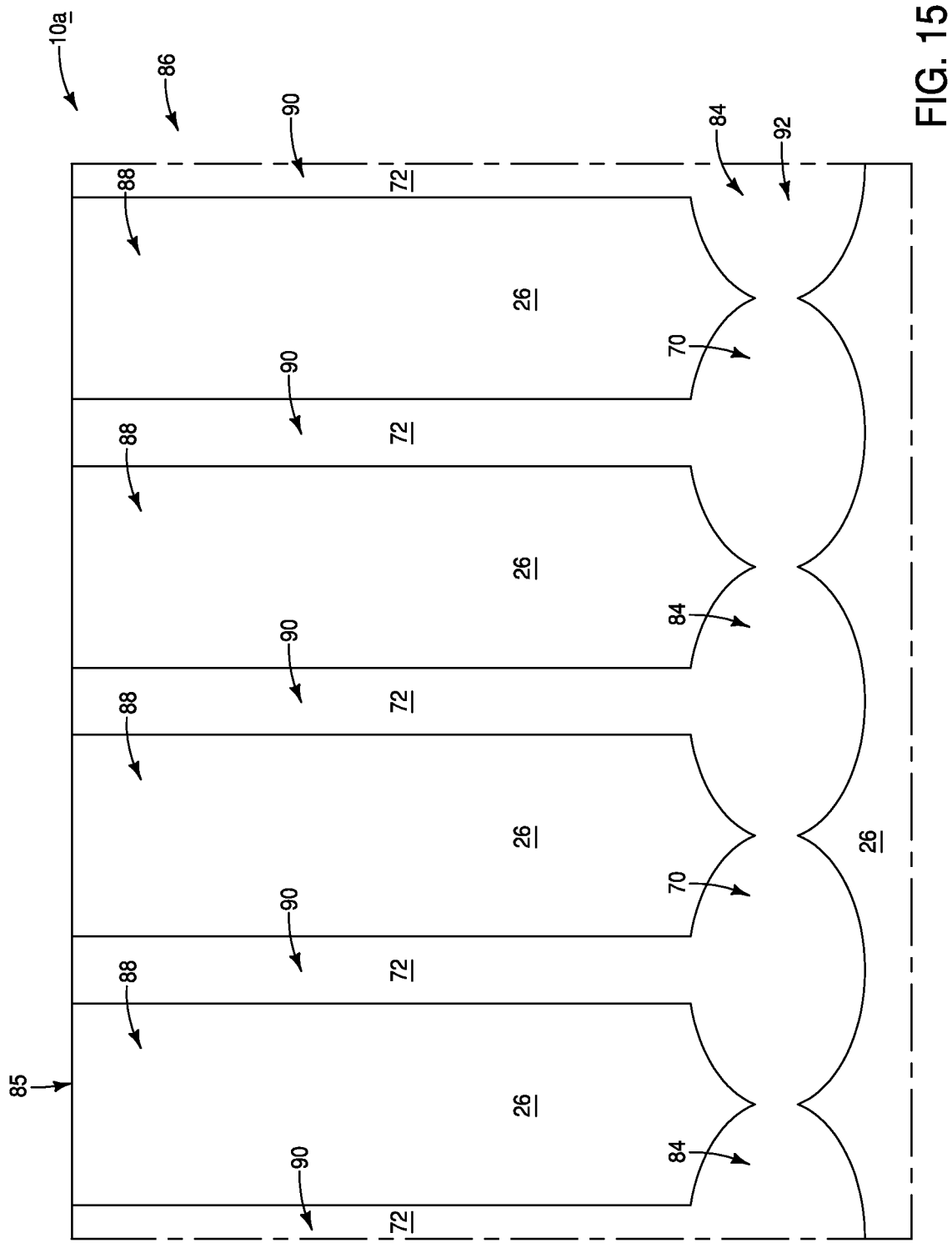

Referring to FIG. 15, the insulative material 72 is removed from over the semiconductor material 26 with a planarization process (e.g., CMP) to form a planarized surface 85 extending across the semiconductor material 26 and the insulative material 72.

In some embodiments, the cross-section of FIG. 15 may be considered to be representative of a construction 86 comprising first posts 88 alternating with second posts 90. The first posts 88 comprise the semiconductor material 26, and the second posts 90 comprise the insulative material 72. In some embodiments, the first posts 88 may be referred to as semiconductor posts, and the second posts 90 may be referred to as insulative posts. The insulative pillars 74 (FIG. 14) become some of the second posts 90.

The second posts 90 merge with one another at bottom regions corresponding to the filled first and second bowl regions 70 and 84. In some embodiments, the second posts 90 may be considered to form an insulative pattern within the mass 62 (FIG. 6) of semiconductor material 26. The bowl regions 70 and 84 may be considered to be bottom portions of the second posts 90. Such bottom portions may be considered to merge with one another to form a merged insulative region 92; which may be referred to herein as an insulative layer, an insulative floor, or simply as an insulative region 92. In some embodiments, the configuration of FIG. 15 may be considered to be a silicon-on-insulator configuration, with the merged insulative region 92 being insulator under the semiconductor material 26.

FIGS. 7-15 show the insulative posts 90 formed with two sequential patterning stages. The first patterning stage (i.e., the processing of FIGS. 7-9) forms a subset of the posts, and the second patterning stage (i.e., the processing of FIGS. 10-14) forms a second subset of the posts which alternates with the first subset of the posts along the cross-section of FIG. 14. In other embodiments, all of the insulative posts 90 may be formed simultaneously, rather than with the sequential patterning stages. However, it may be advantageous to utilize the sequential patterning stages described herein in that such may enable the first subset of the posts (i.e., the subset of FIG. 9) to be formed to a level of integration which is near a limit achievable with the photolithographic process utilized to form the first pattern, and may then enable the final pattern of posts (i.e., the pattern of FIG. 14) to be formed to a level of integration greater than that which could be achieved utilizing the photolithographic process alone.

Figure 16:
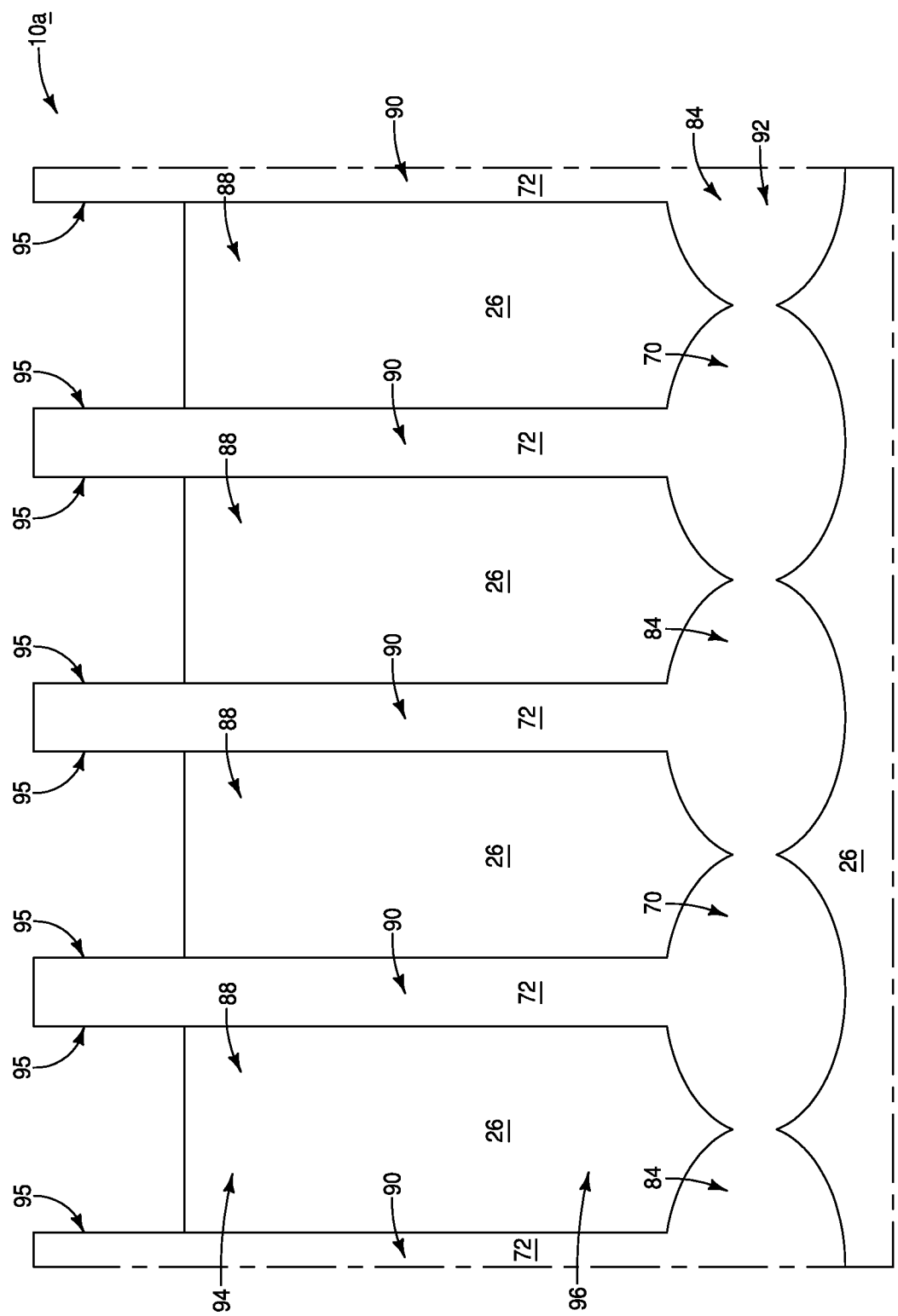

Referring to FIG. 16, the semiconductor material 26 is recessed relative to the insulative material 72. In other words, upper surfaces of the first posts 88 are recessed relative to upper surfaces of the second posts 90. The remaining first posts 88 may be considered to have first regions 94 and second regions 96; with the first regions 94 being vertically offset from the second regions 96. The second regions 96 of the semiconductor posts 88 are proximate the bowl regions 70 and 84 (i.e., are proximate the merged insulative region 92), and the first regions 94 of the semiconductor posts 88 are above the second regions 96.

The recessing of the semiconductor material 26 exposes sidewalls 95 along upper portions of the insulative posts 90.

Figure 17:
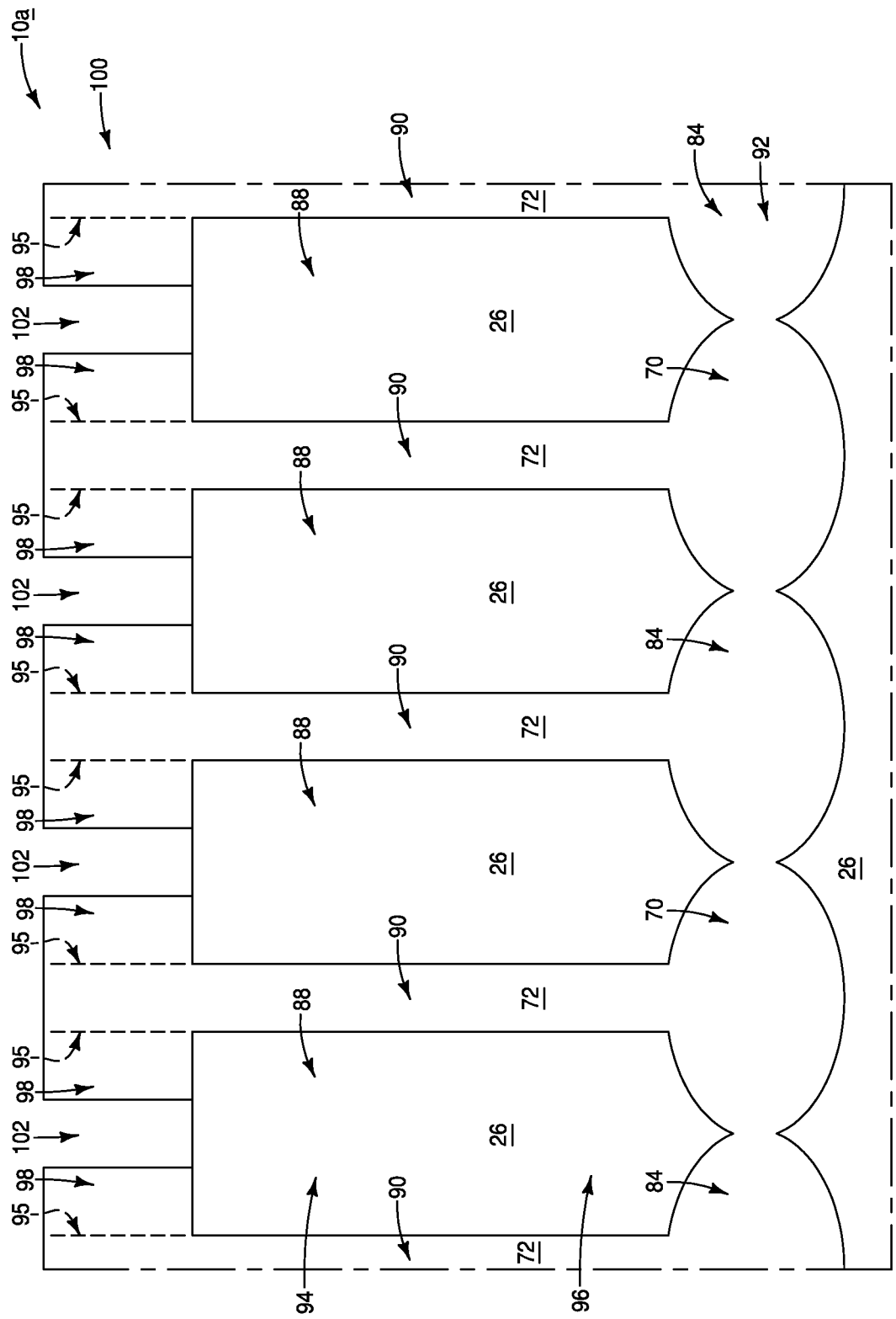

Referring to FIG. 17, spacers 98 are formed along the sidewalls 95 of the posts 90. The spacers may comprise any suitable material, and in some embodiments may comprise the same insulative material 72 (e.g., silicon dioxide) as the posts 90. The spacers 98 may be formed with any suitable processing; such processing analogous to that described above with reference to FIG. 11 for fabrication of the spacers 76.

The spacers 98 form a third patterned mask 100 having openings 102 extending therethrough.

Figure 18:
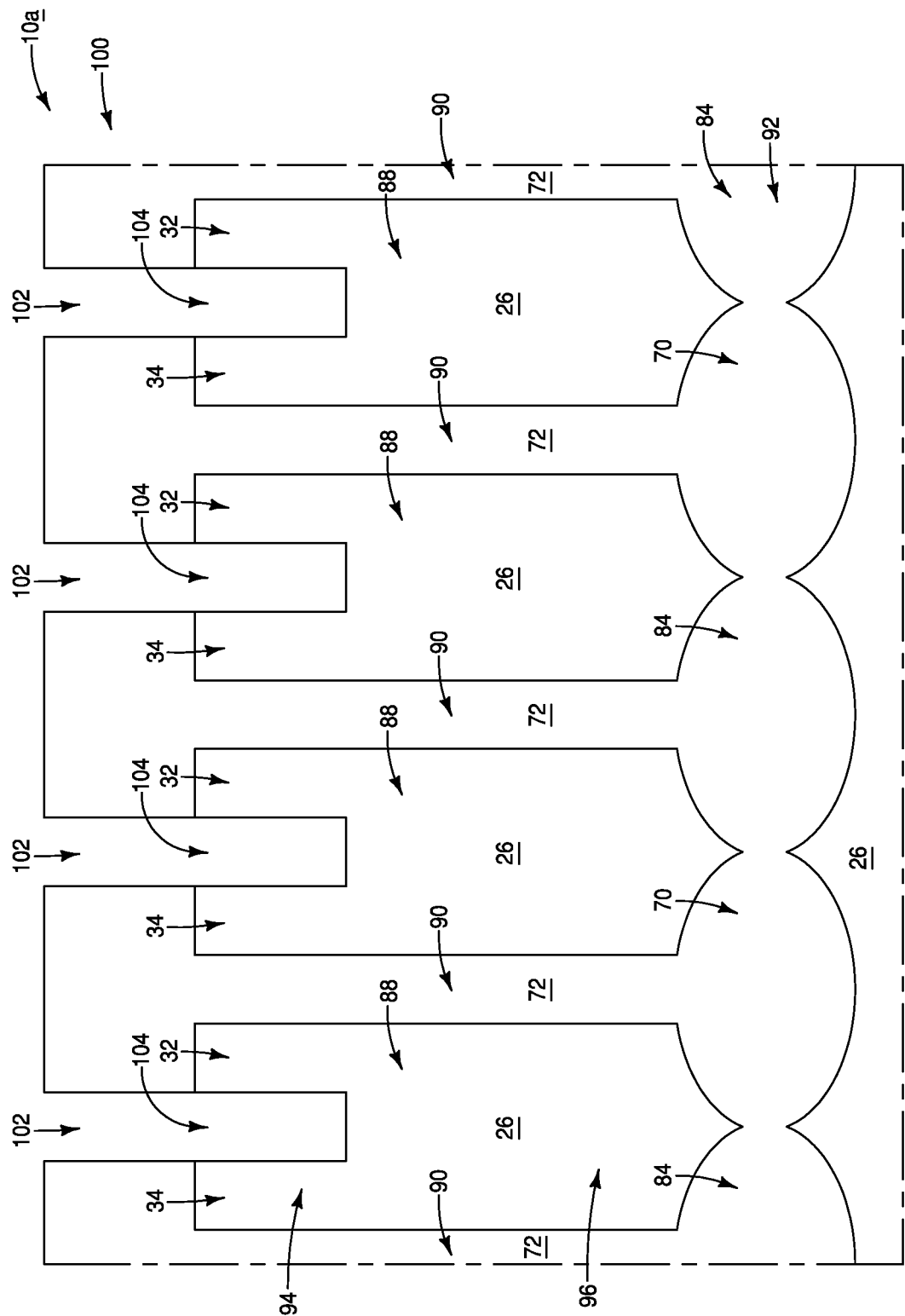

Referring to FIG. 18, the semiconductor material 26 is etched through the openings 102 to form third trenches 104. The trenches 104 extend into the upper regions 94 of the semiconductor posts 88.

Figure 19:
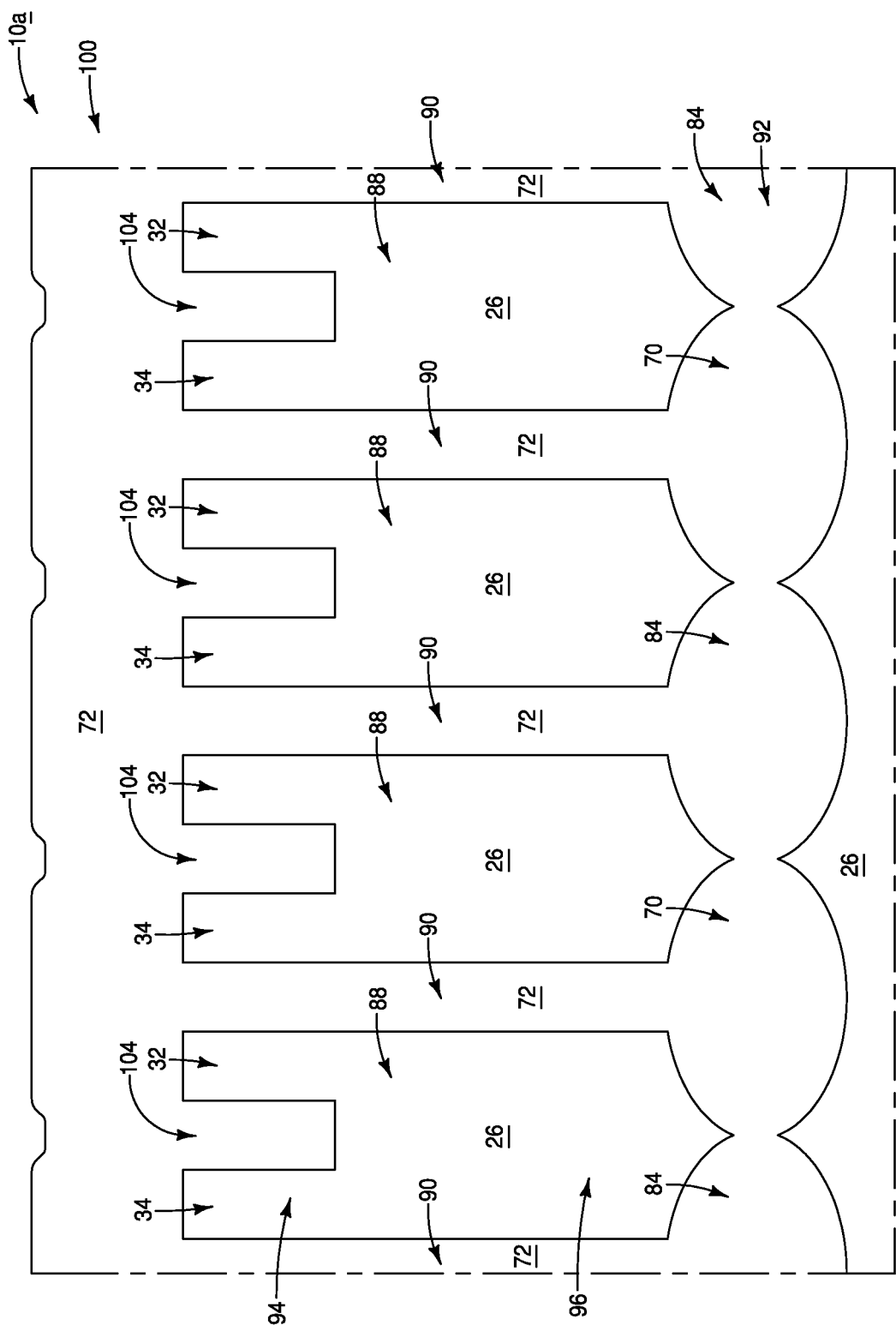

Referring to FIG. 19, the insulative material 72 is formed within the trenches 104. The shown embodiment provides the same insulative material within the trenches 104 as is utilized in the insulative posts 90. In other embodiments, a different insulative material may be provided within the trenches 104 than is utilized in the insulative posts 90.

Figure 20:
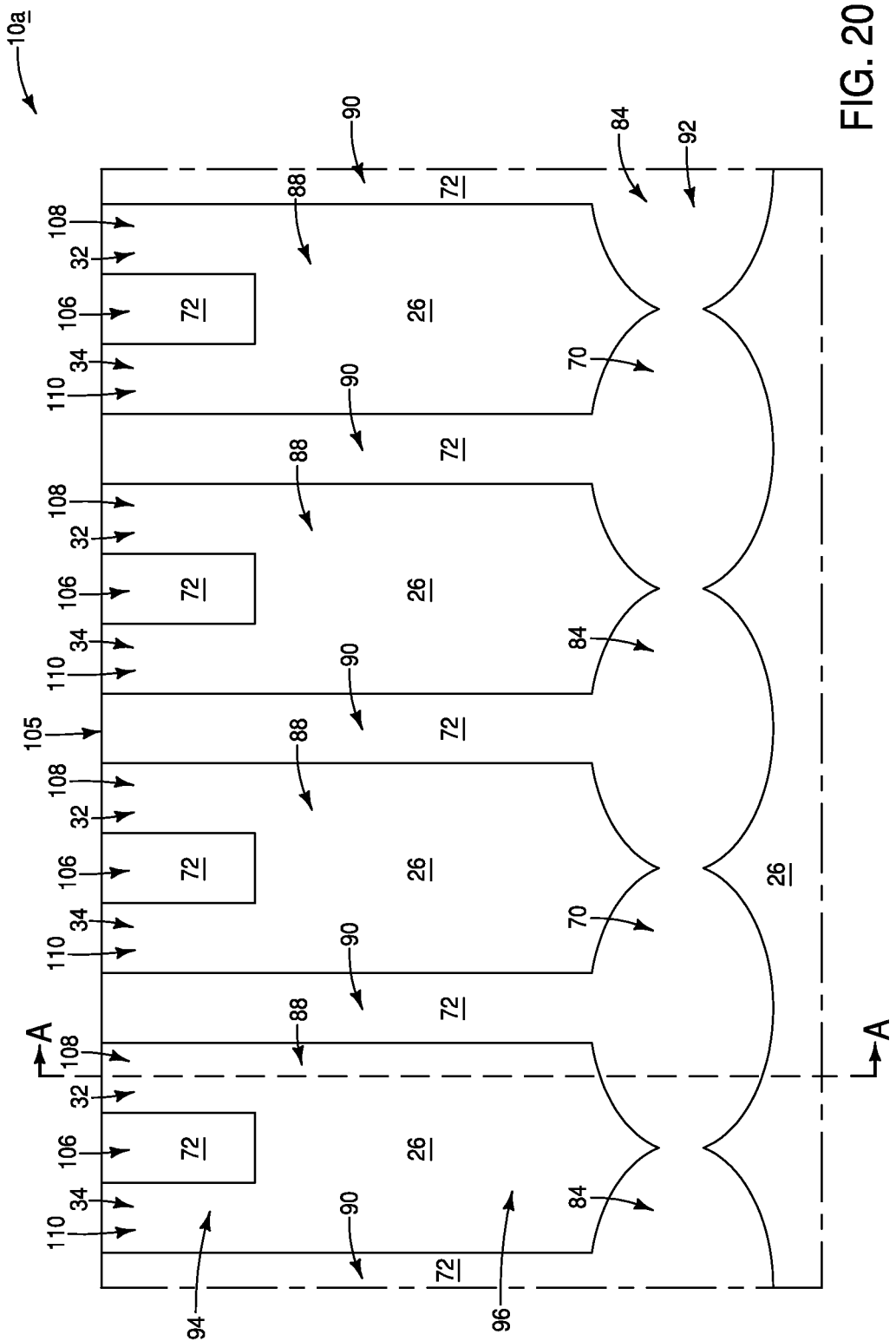

Referring to FIG. 20, the insulative material 72 is removed from over the semiconductor material 26 with a planarization process (e.g., CMP) to form a planarized surface 105 extending across the semiconductor material 26 and the insulative material 72. The insulative material 72 remaining within the trenches 104 is configured as pins 106 extending downwardly into the first regions 94 of the semiconductor posts 88. Such pins 106 split the first regions 94 of the semiconductor posts 88 into third and fourth regions 108 and 110. The third regions 108 correspond to the first legs 32, and the fourth regions 110 correspond to the second legs 34.

Figure 20A:
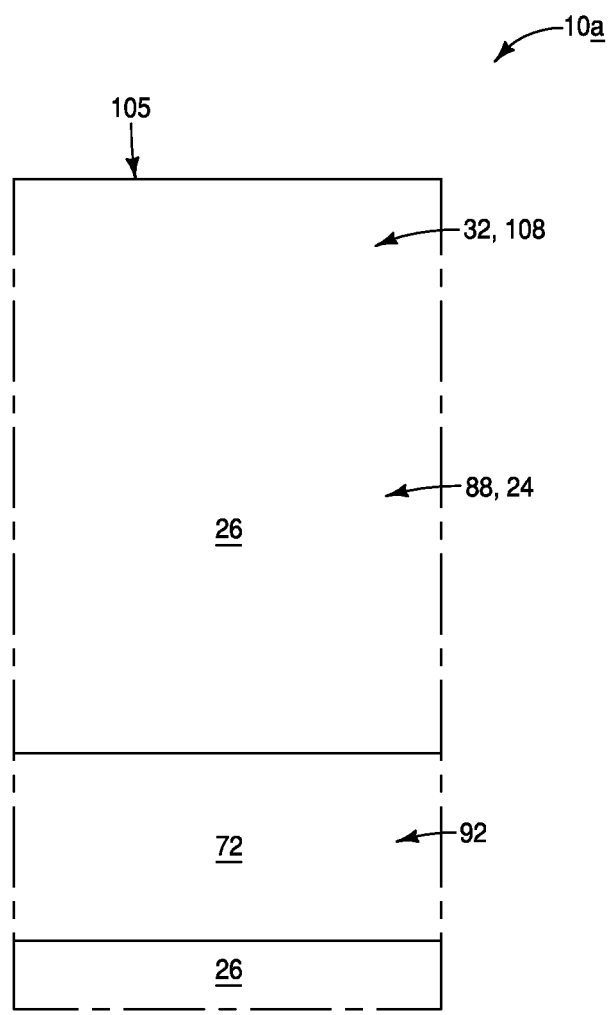

FIG. 20A shows a cross-section along the line A-A of FIG. 20, and shows a region of one of the first posts (i.e., semiconductor posts) 88. The semiconductor posts 88 of FIGS. 20 and 20A may be considered to correspond to semiconductor structures 24 of the type described above with reference to FIGS. 4 and 4A.

Figure 21:
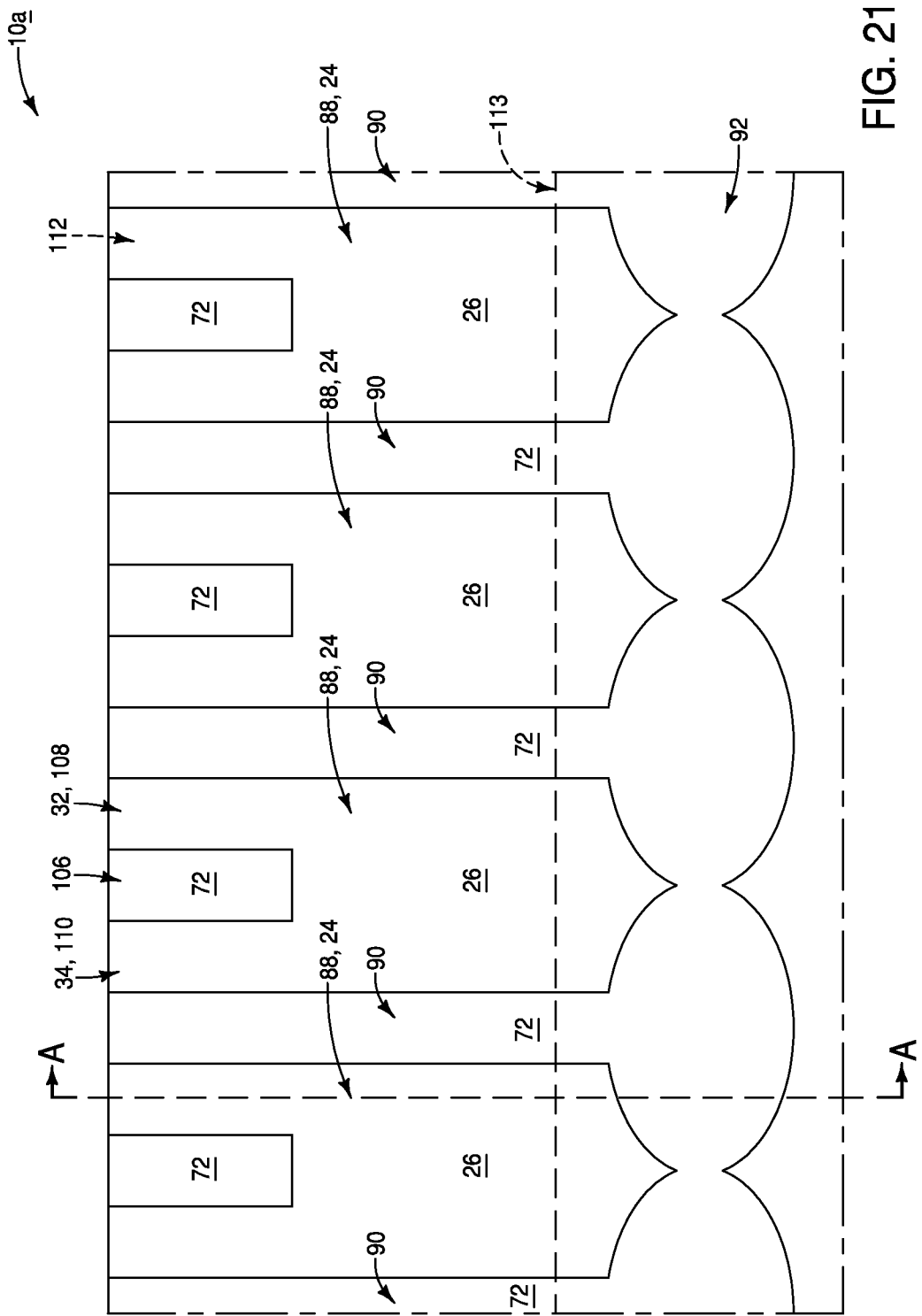
Figure 21A:
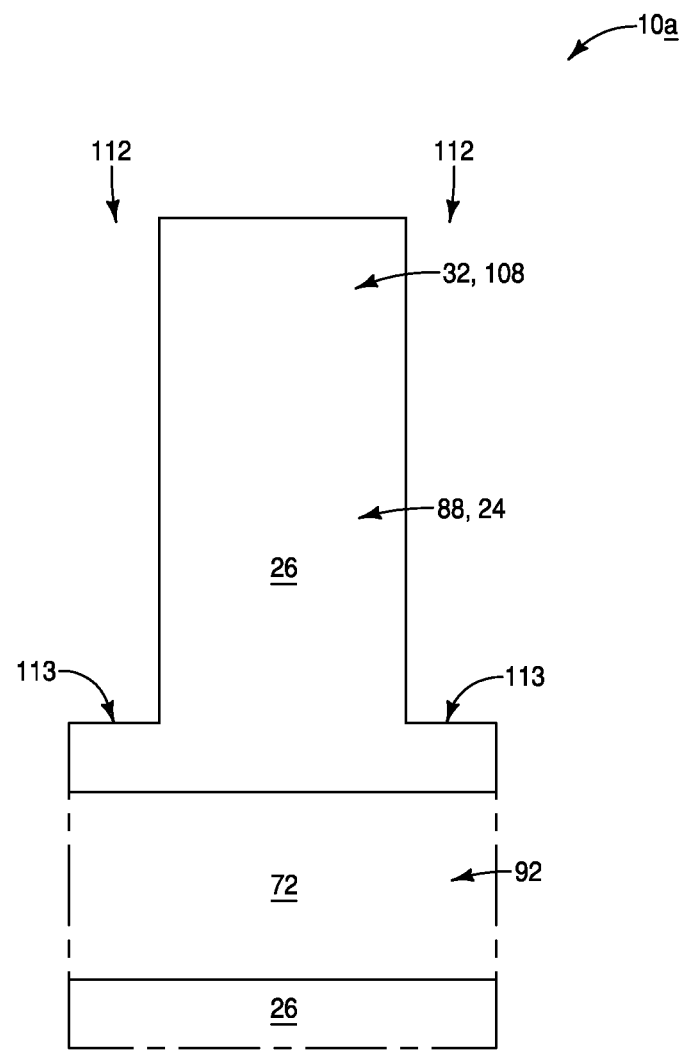

Referring to FIGS. 21 and 21A, trenches 112 are formed to extend along sides of the first and second posts 88 and 90. The trenches 112 have bottom surfaces 113 which are above the insulative region 92. The trenches 112 are visible in FIG. 21A. However, the trenches 112 extend along the same direction as the cross-section of FIG. 21, and are out of the plane of such cross-section. Accordingly, a trench 112 and its bottom surface 113 are diagrammatically illustrated in dashed-line in FIG. 21 to indicate that the trench and its bottom surface are out of the plane of the view.

Figure 22:
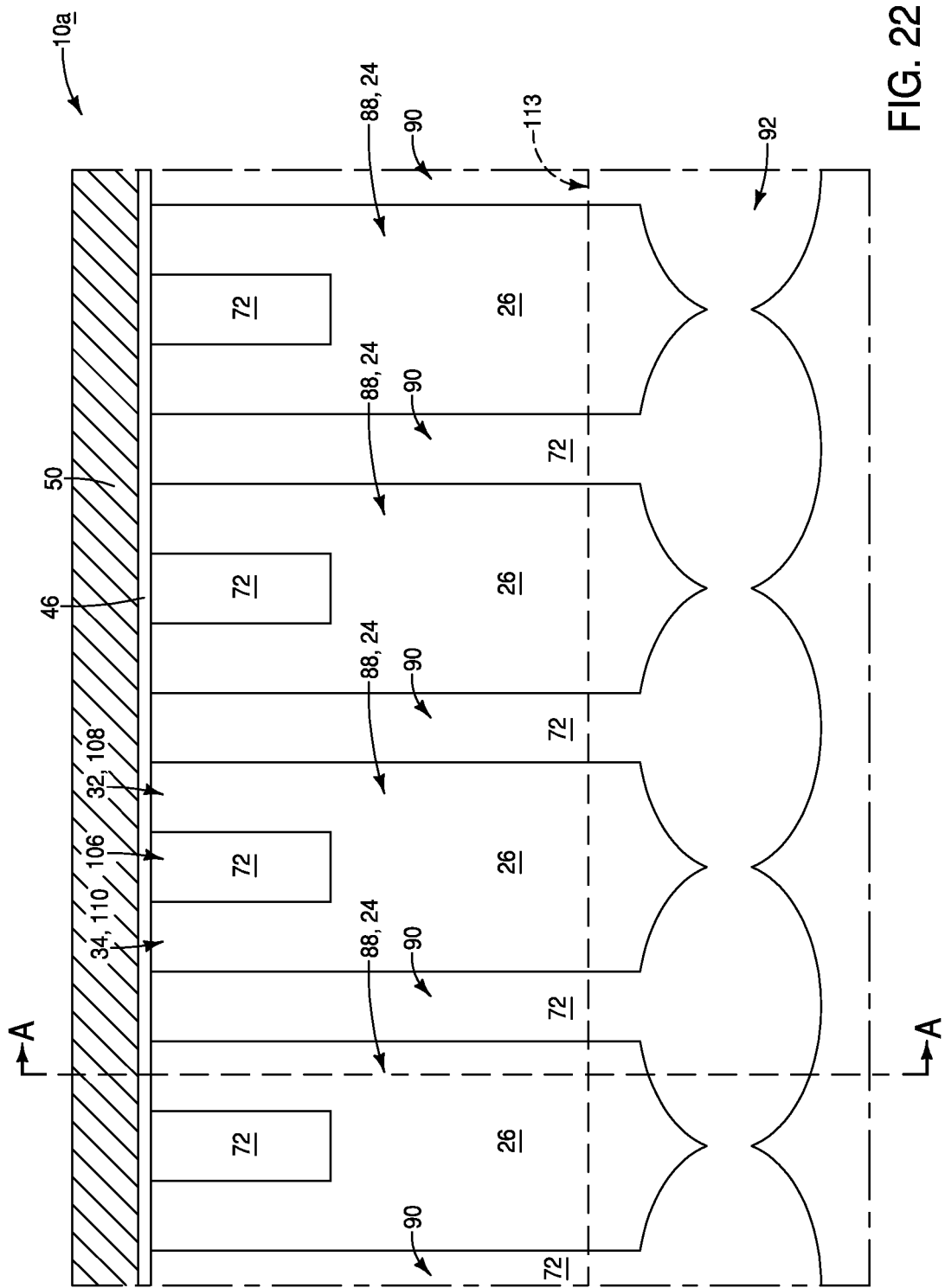
Figure 22A:
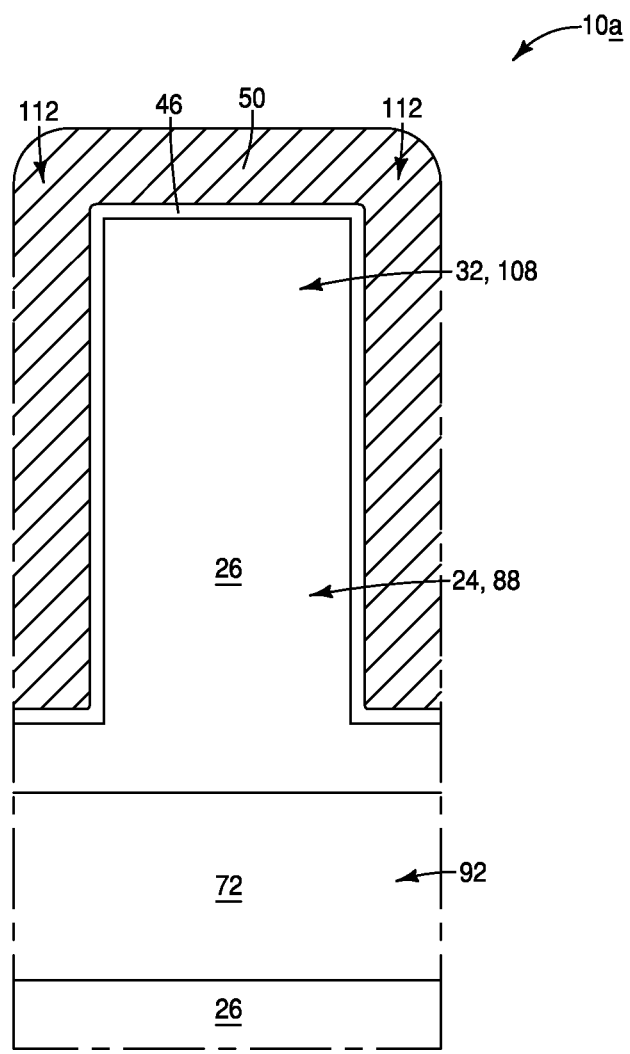

Referring to FIGS. 22 and 22A, insulative material 46 is formed within the trenches 112, and conductive gate material 50 is formed over the insulative material. The insulative material 46 may be referred to as second insulative material to distinguish it from the first insulative material 72. The insulative material 46 and conductive material 50 may be considered to be formed adjacent sides of the first and second posts 88 and 90; with the conductive material 50 being spaced from such sides by the insulative material 46. In some embodiments, the conductive material 50 may be considered to be configured as a line extending along the cross-section of FIG. 22, and extending across the first and second posts 88 and 90.

Figure 23A:
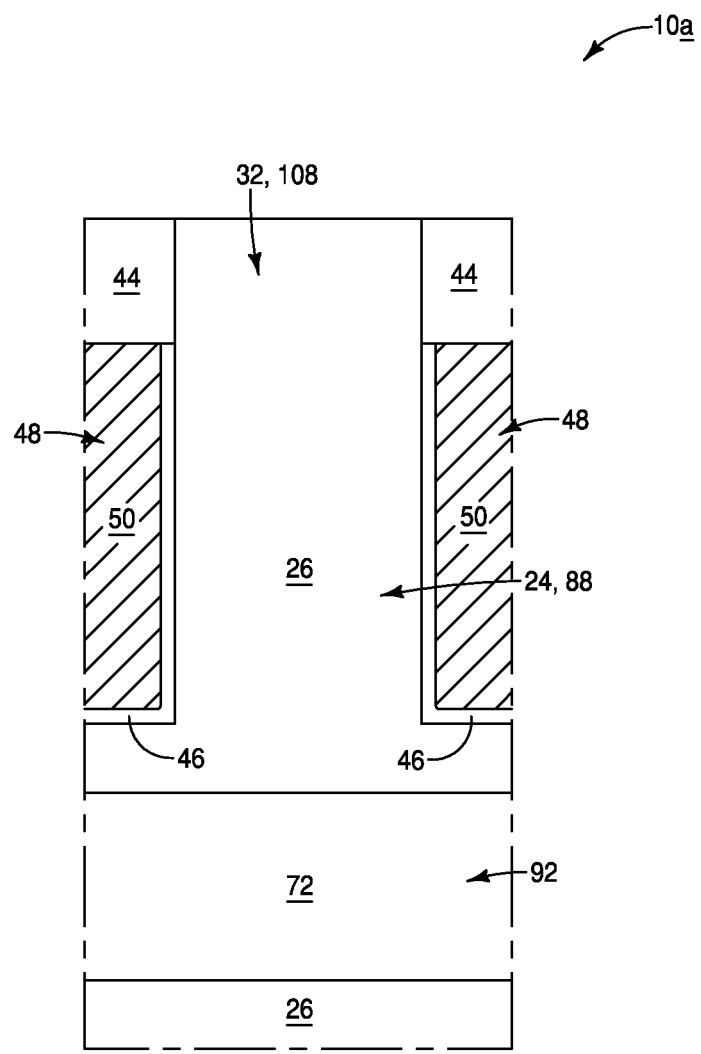

Referring to FIGS. 23 and 23A, upper surfaces of the insulative material 46 and conductive material 50 are recessed, and the insulative material 44 is formed over the recessed upper surfaces. The recessing of the conductive material 50 patterns such material into gates 48. One of the gates 48 is diagrammatically illustrated in FIG. 23. However, such gate is out of the plane relative to the cross-section of FIG. 23, and accordingly is shown in dashed-line view.

Figure 24:
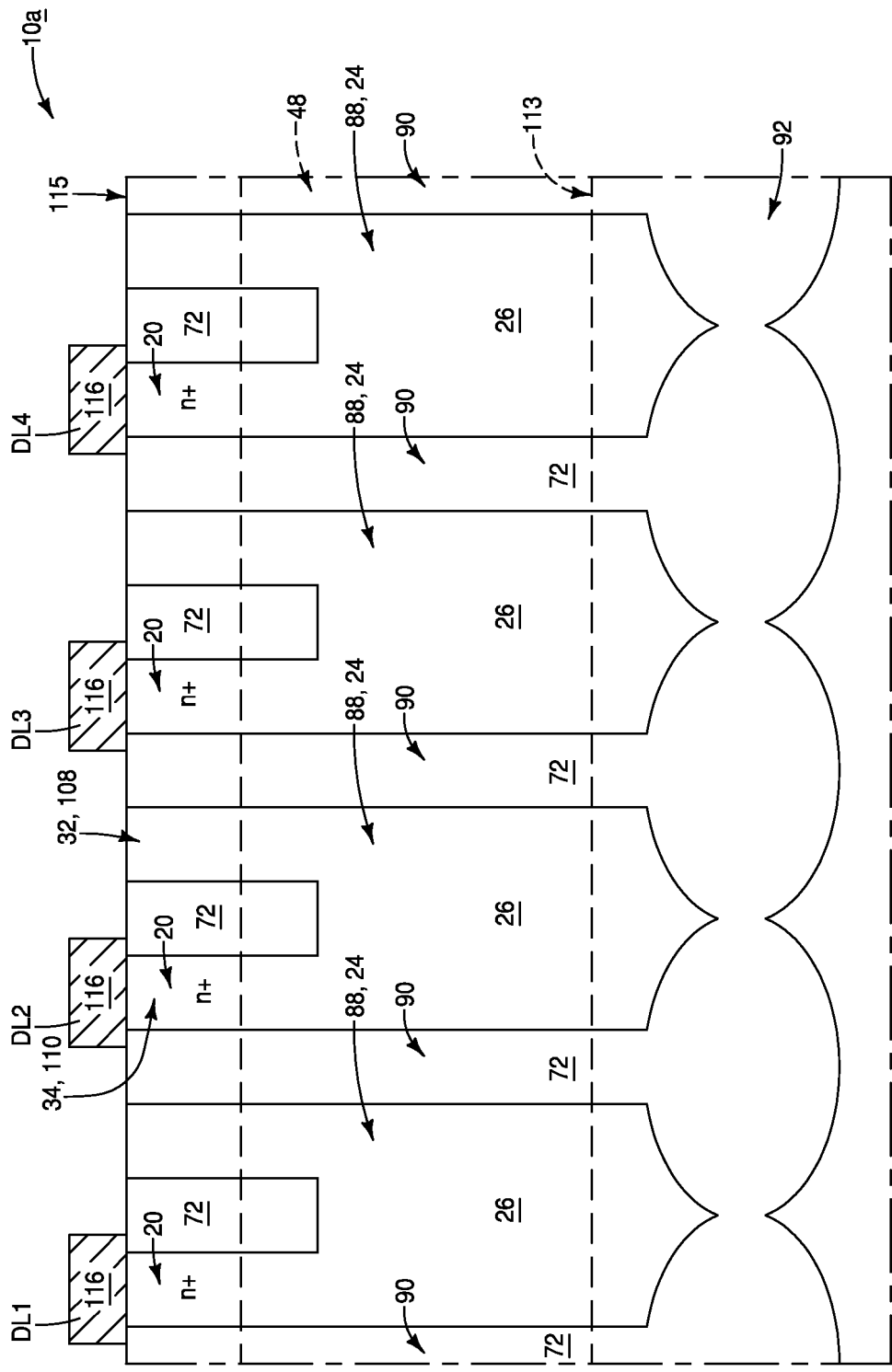

Referring to FIG. 24, the fourth regions 110 of the semiconductor posts 88 are doped to a conductivity type (shown as n-type), and digit lines DL1-DL4 are formed over the fourth regions and electrically coupled with the fourth regions. The doped portions of the fourth regions 110 correspond to the source/drain regions 20 described above with reference to FIGS. 4 and 4A.

The digit lines comprise a digit line material 116. Such material may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The digit lines may be formed by providing appropriate material(s) over an illustrated surface 115, and then patterning the material(s) into the desired configuration of the digit lines. The patterning may comprise utilization of a photolithographically-patterned mask (not shown) or any other suitable methodology.

The doping of the fourth regions 110 may comprise implanting of dopant into the fourth regions 110 and/or may comprise out-diffusion of dopant from the digit line material 116. If the dopant is implanted into the fourth regions 110, the remainder of assembly 10a may be protected with a mask (not shown) so that the dopant is only implanted into the fourth regions 110. If the dopant is provided into the fourth regions 110 utilizing out-diffusion from the digit line material 116, the material 116 may be provided to have a lower portion comprising doped silicon (in some embodiments, the digit line material 116 may comprise one or more metal-containing materials over the doped silicon). After the material 116 is patterned into the digit lines, thermal processing may be utilized to out-diffuse the dopant from the doped silicon of the material 116 and into the fourth regions 110.

Figure 25:
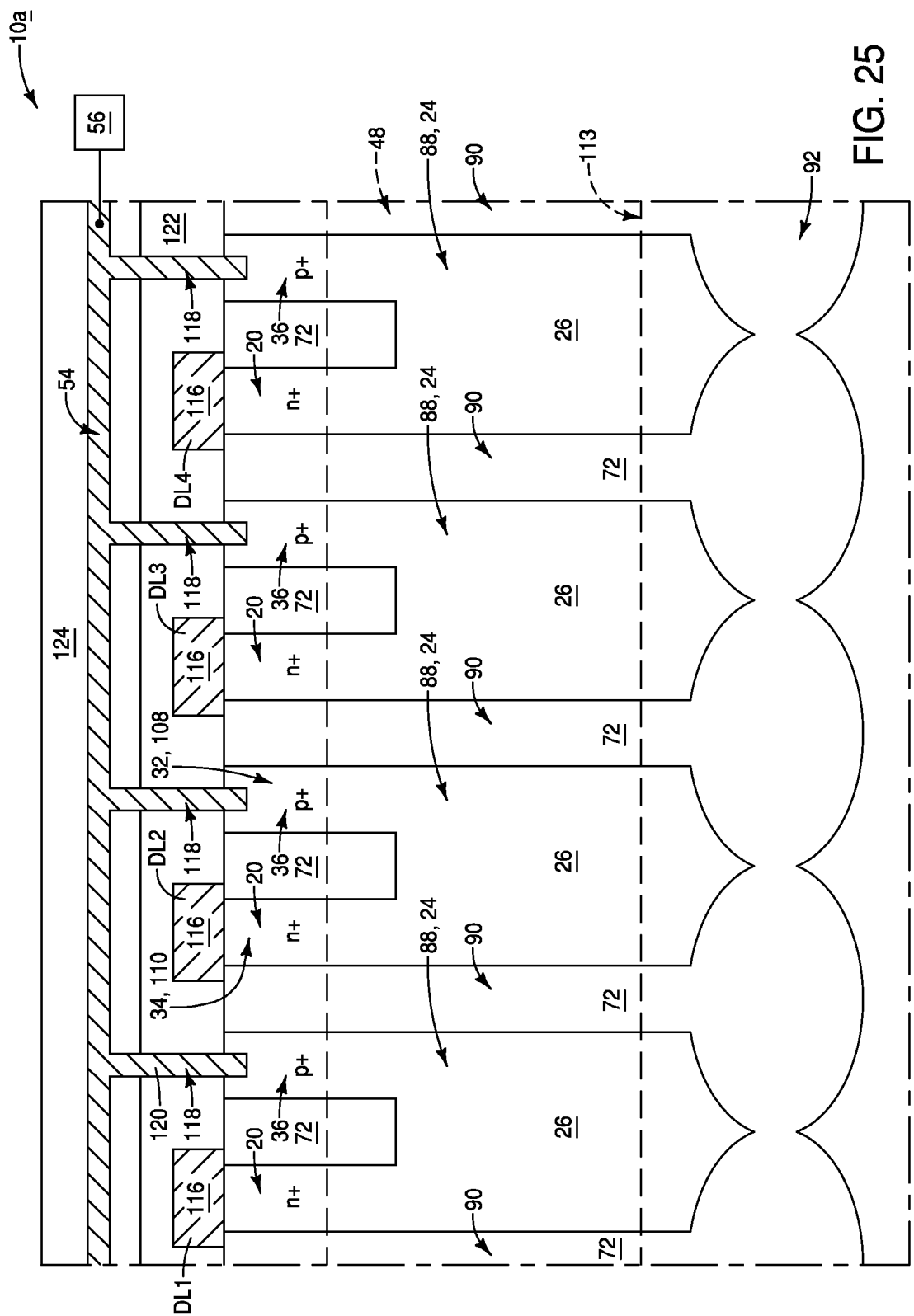

Referring to FIG. 25, the third regions 108 of the semiconductor posts 88 are doped to a conductivity type (shown as p-type), and body contact structures 118 are formed over the third regions and electrically coupled with the third regions. The doped portions of the third regions 108 correspond to the body contact regions 36 described above with reference to FIG. 4.

The body contact regions 36 have an opposite type conductivity relative to the source/drain regions 20. In some embodiments, the conductivity type of the body contact regions 36 may be referred to as a first conductivity type, and the conductivity type of the source/drain regions 20 may be referred to as a second conductivity type. In the shown embodiment, the first conductivity type is p-type and the second conductivity type is n-type. In other embodiments, the first conductivity type may be n-type and the second conductivity type may be p-type.

In some embodiments, the formation of the doped regions 20 and 36 within the semiconductor posts 88 may be considered to correspond to forming of such doped regions within the upper (first) regions 94 of the posts 88; with such upper regions being shown in FIG. 17.

The body contact structures 118 comprise a material 120. Such material may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The body contact structures 118 are coupled with the wiring 54 described above with reference to FIG. 4. The body contact structures 118 and wiring 54 are surrounded by insulative materials 122 and 124. The insulative materials 122 and 124 may comprise any suitable composition(s); such as, for example, silicon dioxide, silicon nitride, etc. The materials 122 and 124 may comprise the same composition as one another, or may comprise different compositions relative to one another.

The body contact structures 118 and wiring 54 may be patterned with any suitable methods. Persons of ordinary skill may readily determine methods for patterning the structures 118 and the wiring 54. The structures 118 and the wiring 54 are shown to comprise the same material 120. In other embodiments, they may comprise different materials relative to one another.

The doping of the third regions 108 may comprise implanting of dopant into the third regions 108 and/or may comprise out-diffusion of dopant from the material 120. If the dopant is implanted into the third regions 108, the remainder of assembly 10a may be protected with a mask (not shown) so that the dopant is only implanted into the third regions 108. If the dopant is provided into the third regions 108 utilizing out-diffusion from the material 120, the material 20 may be provided to have a lower portion comprising doped silicon. Thermal processing may be utilized to out-diffuse the dopant from the material 120 into the third regions 108.

Figure 26:
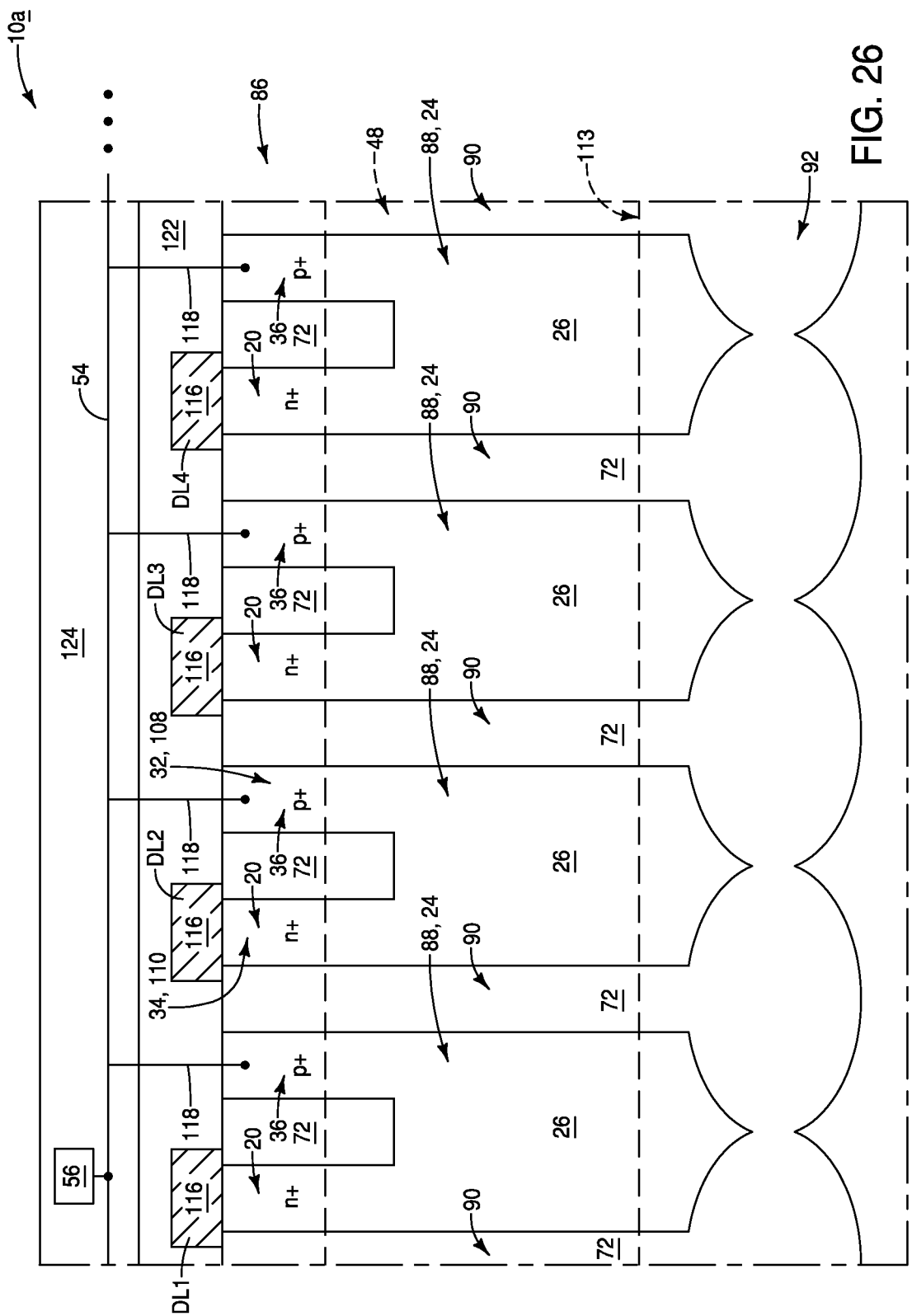

FIG. 26 shows the same processing stage as FIG. 25, but with a simplified (more schematic) representation of the body contact structures 118 and the wiring 54. The simplified representation of FIG. 26 will be utilized in the remaining drawings. The assembly 10a of FIG. 26 may be considered to correspond to the construction 86 described above with reference to FIG. 15 having modifications introduced through the process stages of FIGS. 16-25.

Figure 27:
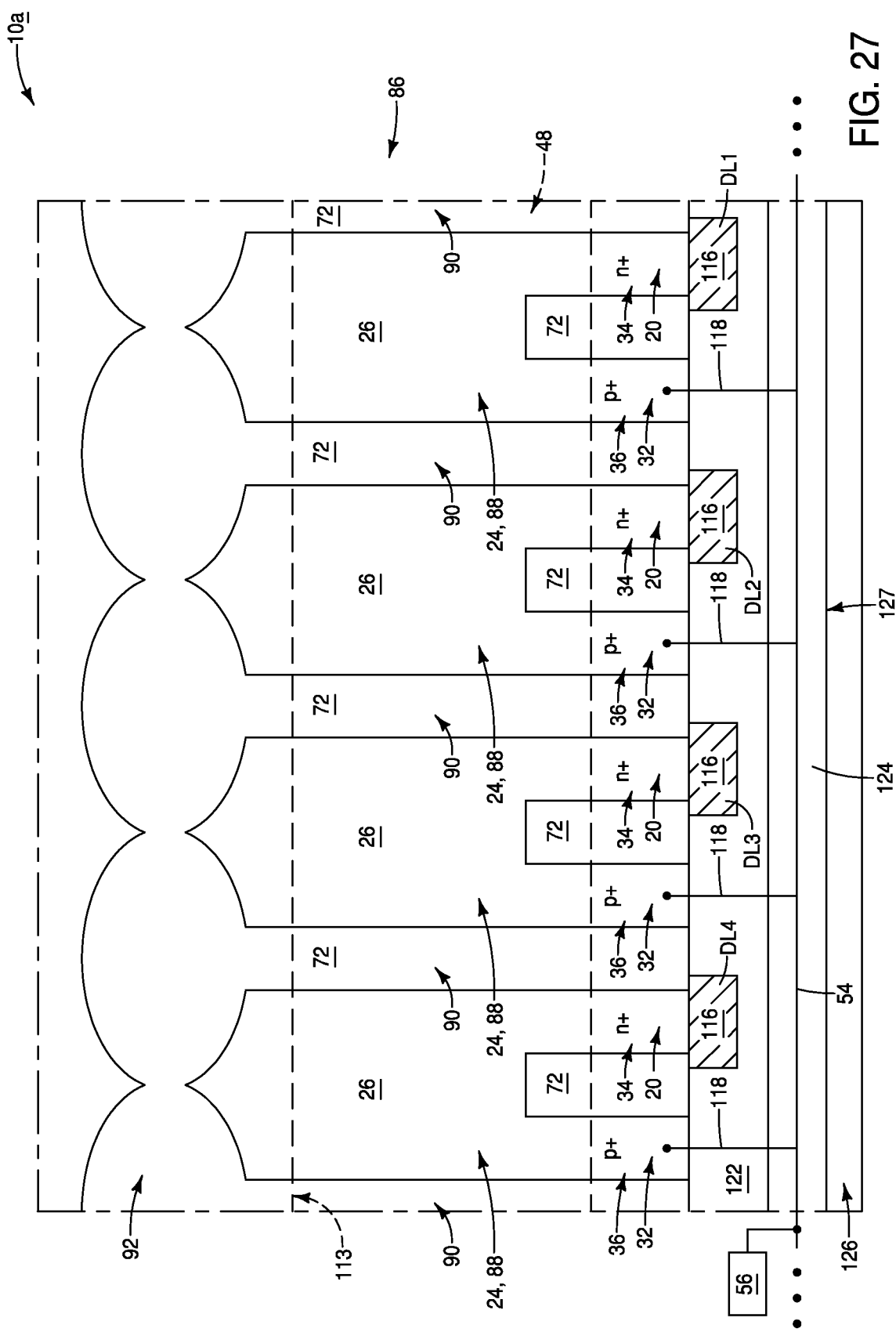

Referring to FIG. 27, the construction 86 is inverted and bonded to a support (or base) wafer 126. The bonding of the construction 86 to the support wafer 126 occurs at an interface 127. The bonding may be accomplished utilizing any suitable processing; including, for example, techniques in which two silicon dioxide surfaces are placed against one another and subjected to appropriate treatment to induce covalent bonding between the surfaces and thereby form a composite structure. The treatment utilized to induce the covalent bonding may be a thermal treatment. Such thermal treatment may utilize a temperature in excess of 800° C. Alternatively, one or both of the silicon dioxide surfaces may be subjected to a plasma treatment prior to the thermal treatment, and then the temperature of the thermal treatment may be reduced to a temperature within a range of from about 150° C. to about 200° C. The bonding of the silicon dioxide surfaces to one another may be referred to as "hybrid bonding".

Figure 28:
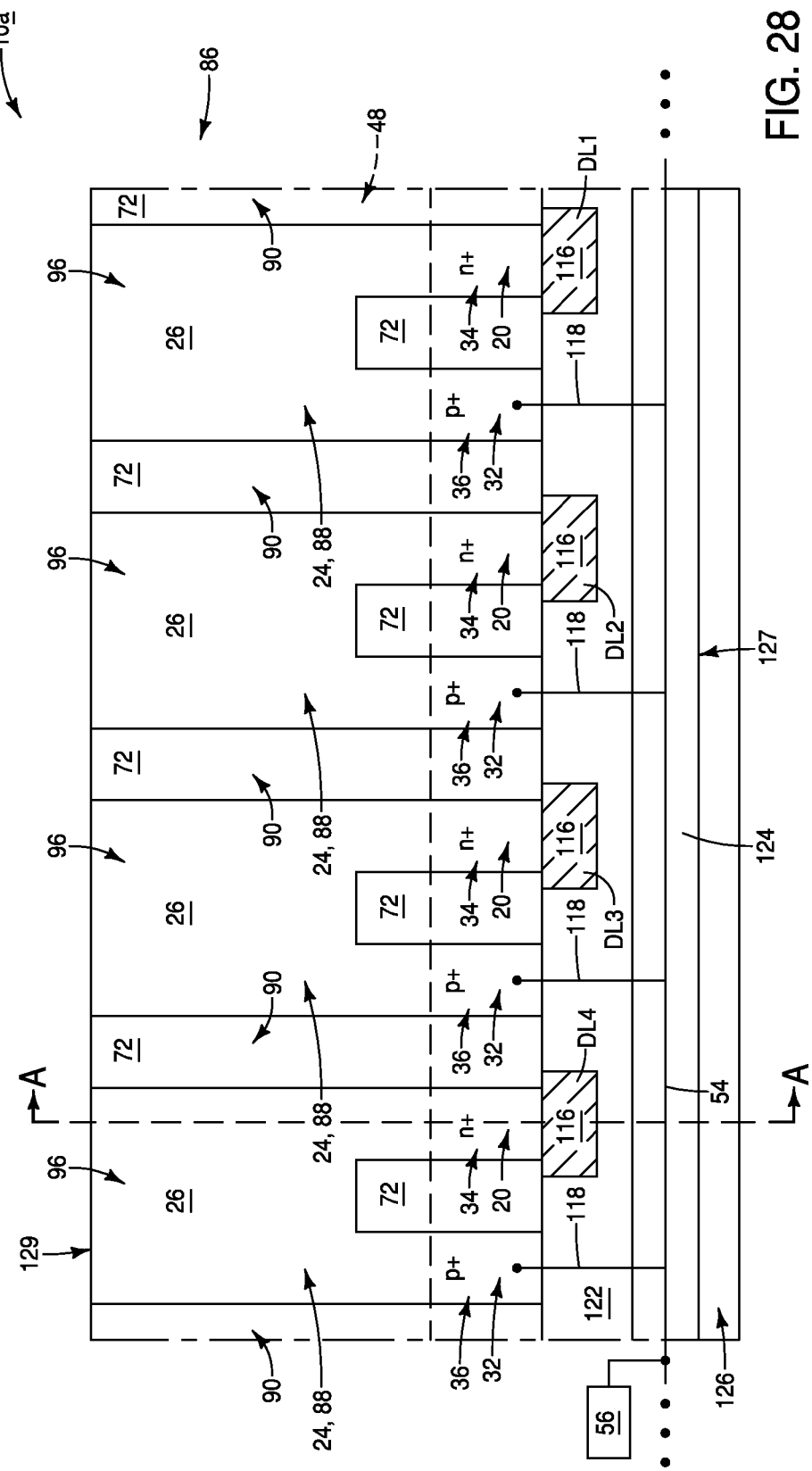
Figure 28A:
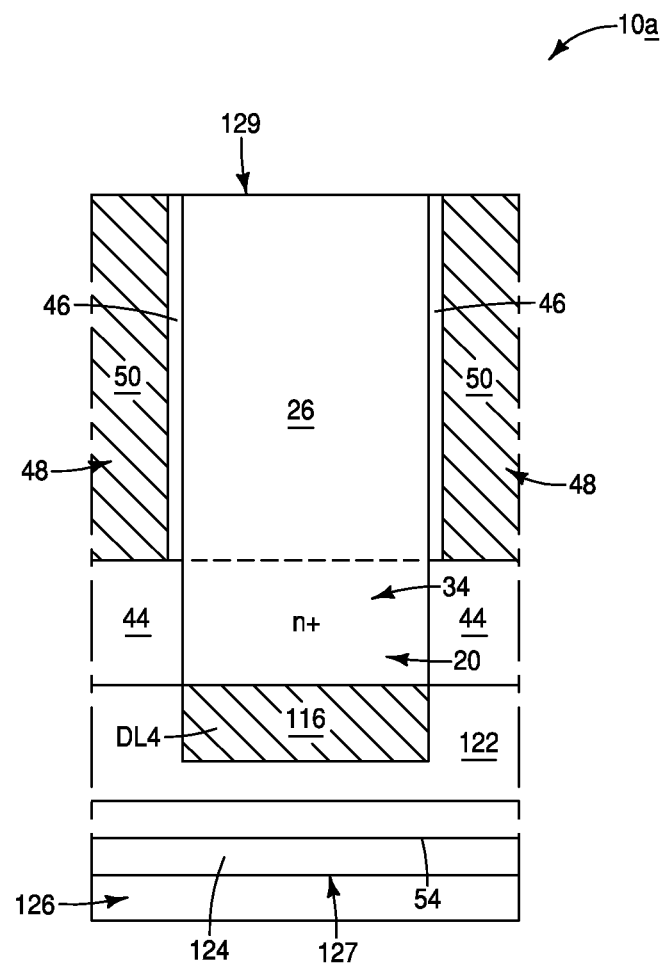

Referring to FIGS. 28 and 28A, an upper region of the inverted construction 86 is removed to expose upper surfaces of the gate material 50. In the shown embodiment, such removal utilizes planarization (e.g., CMP) and forms a planarized upper surface 129. The planarized surface 129 extends across the first and second posts 88 and 90, across the gate dielectric material 46 (FIG. 28A), and across the gate material 50 (FIG. 28A). The insulative region 92 (FIG. 27) is removed by the CMP, and the second regions 96 of the semiconductor posts 88 are exposed (with the second regions 96 being described above with reference to FIG. 16).

Figure 29A:
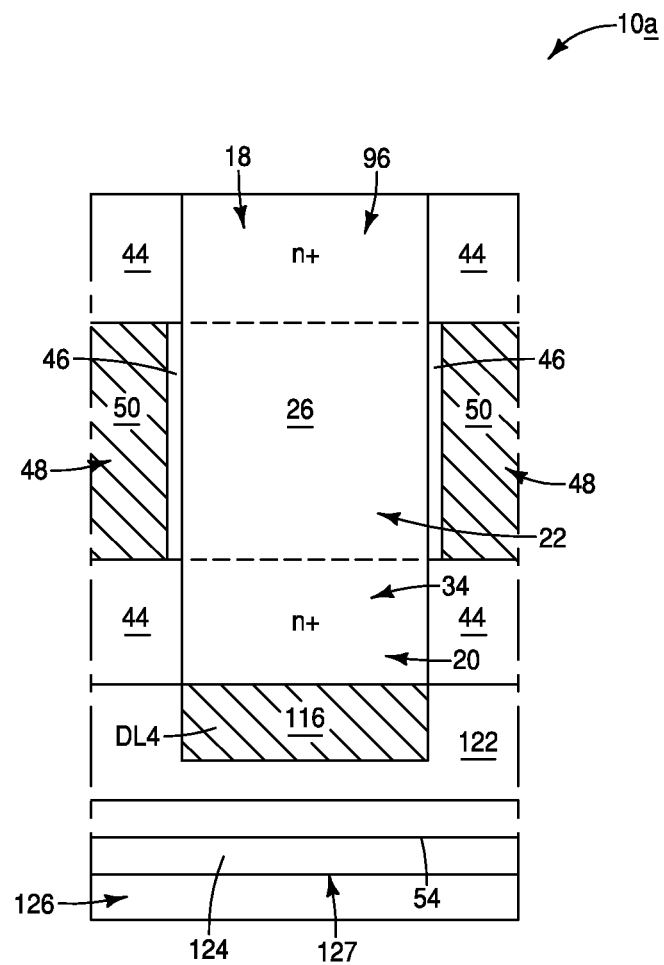

Referring to FIGS. 29 and 29A, the conductive material 50 (FIG. 29A) and the insulative material 46 (FIG. 29A) are recessed, and the insulative 44 (FIG. 29A) is formed over the recessed materials 50 and 46; and the exposed second regions 96 of the semiconductor posts 88 are doped to form the source/drain regions 18.

The dopant provided within the source/drain regions 18 is the same type as the dopant provided within the source/drain regions 20, and in the shown embodiment is n-type. The semiconductor structures 24 of FIGS. 29 and 29A are analogous to those described above with reference to FIGS. 4 and 4A; and comprise the source/drain regions 18 and 20, the body contact regions 36, and the body regions 22.

Referring to FIG. 30, charge-storage devices 52 are coupled with the source/drain regions 18 (i.e., are coupled with the second regions 96 of the semiconductor posts 88). The charge-storage devices 52 may comprise capacitors in some example embodiments.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a semiconductor-containing structure with a body region vertically between an upper region and a lower region. The upper region includes a first source/drain region. The lower region is split into two legs which are both joined to the body region. One of the legs includes a second source/drain region and the other of the legs includes a body contact region. The first and second source/drain regions are of a first conductivity type, and the body contact region is of a second conductivity type which is opposite to the first conductivity type. An insulative material is adjacent to the body region. A conductive gate is adjacent to the insulative material, and is spaced from the body region by the insulative material. A transistor includes the semiconductor-containing structure, the conductive gate and the insulative material.

Some embodiments include a method of forming an integrated assembly. First trenches are formed to extend vertically into a semiconductor material. The first trenches are laterally spaced from one another. First bowl regions are formed along lower portions of the first trenches. Second trenches are formed between the first trenches. Second bowl regions are formed along lower portions of the second trenches. The first and second bowl regions merge with one another. The first and second trenches, and the first and second bowl regions, are filled with insulative material to form a construction comprising, along a cross-section, first posts alternating with second posts. The first posts comprise the semiconductor material, and the second posts comprise the insulative material. The second posts merge with one another at bottom regions corresponding to the filled first and second bowl regions.

Some embodiments include a method of forming an integrated assembly. A construction is formed to have alternating first and second posts along a cross-section. The first posts comprise semiconductor material, and the second posts comprise first insulative material. The first posts have first regions vertically offset from second regions, with the first regions being above the second regions. The first regions are split into third and fourth regions by forming insulative pins extending downwardly into the first regions. Second insulative material is formed adjacent to sides of the first posts. Conductive gate material is formed adjacent to the second insulative material. The conductive gate material is configured as a line extending along the cross-section and across the first and second posts. The third and fourth regions of the first posts are doped, with the third regions being doped to a first conductivity type and with the fourth regions being doped to a second conductivity type which is opposite to the first conductivity type. The construction is inverted and the second regions of the first posts are exposed. The exposed second regions of the first posts are doped to the second conductivity type.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming an integrated assembly, comprising:
   forming first trenches extending vertically into a semiconductor material; the first trenches being laterally spaced from one another;
   forming first bowl regions along lower portions of the first trenches;
   forming second trenches between the first trenches;
   forming second bowl regions along lower portions of the second trenches; the first and second bowl regions merging with one another;
   filling the first and second trenches and the first and second bowl regions with insulative material to form a construction comprising, along a cross-section, first posts alternating with second posts; the first posts comprising the semiconductor material and the second posts comprising the insulative material; the second posts merging with one another at bottom regions corresponding to the filled first and second bowl regions; and
   wherein the forming of the first trenches is formed at a different method step than the forming of the second trenches.

2. The method of claim 1 comprising;
   forming a first patterned mask over the semiconductor material, with the first patterned mask having openings extending therethrough in locations for the first trenches; the forming of the first trenches comprising etching into the semiconductor material through the openings in the first patterned mask;
   filling the first trenches and the first bowl regions with the insulative material while the first patterned mask remains over the semiconductor material, and before forming the second trenches; the insulative material within the first trenches being pillars which extend upwardly past an upper surface of the semiconductor material and into the first patterned mask;
   removing the first patterned mask to expose sidewalls of the pillars; and
   forming spacers along the sidewalls of the pillars, the spacers forming a second patterned mask having openings extending therethrough in locations of the second trenches; the forming of the second trenches comprising etching into the semiconductor material through the openings in the second patterned mask.

3. The method of claim 2 wherein the spacers comprise the insulative material.

4. The method of claim 3 wherein the semiconductor material comprises silicon, and wherein the spacers comprise silicon dioxide.

5. The method of claim 1 wherein the insulative material is a first insulative material, wherein the first posts having first regions vertically offset from second regions, with the second regions being proximate the first and second bowl regions; and comprising;
   forming second insulative material adjacent sides of the first posts;
   forming conductive gate material adjacent the second insulative material;
   doping the first regions of the first posts;
   inverting the construction and removing an upper region of the inverted construction to remove the bowl regions and expose the second regions of the first posts; and
   doping the exposed second regions of the first posts.

6. The method of claim 5 further comprising forming digit lines over the first regions prior to inverting the construction.

7. The method of claim 6 wherein the digit lines comprise doped material, and wherein the doping of the first regions comprises out-diffusion of dopant from the doped material of the digit lines.

8. The method of claim 6 wherein the doping of the first regions comprises implanting dopant into the first regions prior to forming the digit lines.

9. The method of claim 1 wherein the insulative material is a first insulative material, wherein the first posts having first regions vertically offset from second regions, with the second regions being proximate the first and second bowl regions; and comprising;
   splitting the first regions into third and fourth regions by forming insulative pins extending downwardly into the first regions;
   forming second insulative material adjacent sides of the first posts;
   forming conductive gate material adjacent the second insulative material;
   doping the third and fourth regions of the first posts, with the third regions being doped to a first conductivity type and the fourth regions being doped to a second conductivity type which is opposite to the first conductivity type;
   inverting the construction and removing an upper region of the inverted construction to remove the bowl regions and expose the second regions of the first posts; and
   doping the exposed second regions of the first posts to the second conductivity type.

10. The method of claim 9 wherein the first conductivity type is p-type and the second conductivity type is n-type.

11. The method of claim 9 wherein the first conductivity type is n-type and the second conductivity type is p-type.

12. The method of claim 9 further comprising, prior to inverting the construction:
    forming digit lines coupled with the fourth regions; and
    forming body contact structures coupled with the third regions.

13. The method of claim 12 wherein the digit lines comprise doped material, and wherein the doping of the fourth regions comprises out-diffusion of dopant from the doped material of the digit lines.

14. The method of claim 12 wherein the doping of the fourth regions comprises implanting dopant into the fourth regions prior to forming the digit lines.

15. The method of claim 12 wherein the body contact structures comprise doped material, and wherein the doping of the third regions comprises out-diffusion of dopant from the doped material of the body contact structures.

16. The method of claim 12 wherein the doping of the third regions comprises implanting dopant into the third regions prior to forming the body contact structures.

17. The method of claim 1 wherein the forming of the first bowl regions is formed before the forming of the second trenches.

18. The method of claim 1 wherein the forming of the first bowl regions is formed before the forming of the second bowl regions.

19. The method of claim 1 wherein the forming of the first bowl regions is formed at a different method step than the forming of the second bowl regions.

20. The method of claim 1 wherein the filling of the first trenches is filled at a different method step than the filling of the second trenches.

21. The method of claim 1 wherein the filling of the first bowl regions is filled at a different method step than the filling of the second bowl regions.

22. The method of claim 1 wherein the filling of the first bowl regions is filled before the forming of the second trenches.

23. The method of claim 1 wherein the filling of the first bowl regions is filled before the filling of the second bowl regions.

24. The method of claim 1 wherein the filling of the first trenches is filled before the filling of the second trenches.

25. A method of forming an integrated assembly, comprising:
    forming a construction having alternating first and second posts along a cross-section; the first posts comprising semiconductor material and the second posts comprising first insulative material; the first posts having first regions vertically offset from second regions, with the first regions being above the second regions;
    splitting the first regions into third and fourth regions by forming insulative pins extending downwardly into the first regions;
    forming second insulative material adjacent sides of the first posts;
    forming conductive gate material adjacent the second insulative material, the conductive gate material being configured as a line extending along the cross-section and across the first and second posts;
    doping the third and fourth regions of the first posts, with the third regions being doped to a first conductivity type and the fourth regions being doped to a second conductivity type which is opposite to the first conductivity type;
    inverting the construction and exposing the second regions of the first posts; and
    doping the exposed second regions of the first posts to the second conductivity type.

26. The method of claim 25 wherein the forming of the construction comprises forming an insulative pattern within a mass of the semiconductor material; the insulative pattern comprising the second posts, with the second posts having bottom portions that merge with one another along a merged insulative region; and wherein the exposing of the second regions of the first posts comprises removing the merged insulative region.

27. The method of claim 25 wherein the forming of the insulative pattern comprises:
    forming a first patterned mask over the semiconductor material, with the first patterned mask having openings extending therethrough in locations for first trenches;
    etching into the semiconductor material through the openings in the first patterned mask to form the first trenches;
    widening bottom regions of the first trenches to form first bowl regions;
    filling the first trenches and the first bowl regions with the insulative material while the first patterned mask remains over the semiconductor material; the insulative material within the first trenches being pillars which extend upwardly past an upper surface of the semiconductor material and into the first patterned mask;
    removing the first patterned mask to expose sidewalls of the pillars;
    forming spacers along the sidewalls of the pillars, the spacers forming a second patterned mask having openings extending therethrough in locations of second trenches;
    etching into the semiconductor material through the openings in the second patterned mask to form the second trenches;
    widening bottom regions of the second trenches to form second bowl regions which contact the insulative material within the first bowl regions; and
    filling the second trenches and the second bowl regions with the insulative material; the filled first and second bowl regions together being the merged insulative region.

28. The method of claim 25 further comprising, prior to inverting the construction:
    forming digit lines coupled with the fourth regions; and
    forming body contact structures coupled with the third regions.

29. The method of claim 28 further comprising forming charge-storage devices coupled with the second regions.

30. The method of claim 25 wherein the first conductivity type is p-type and the second conductivity type is n-type.

31. The method of claim 25 wherein the first conductivity type is n-type and the second conductivity type is p-type.

32. A method of forming an integrated assembly, comprising:
    forming first trenches extending vertically into a semiconductor material; the first trenches being laterally spaced from one another;
    forming first bowl regions along lower portions of the first trenches;
    forming second trenches between the first trenches;
    forming second bowl regions along lower portions of the second trenches; the first and second bowl regions merging with one another;
    filling the first and second trenches and the first and second bowl regions with insulative material to form a construction comprising, along a cross-section, first posts alternating with second posts; the first posts comprising the semiconductor material and the second posts comprising the insulative material; the second posts merging with one another at bottom regions corresponding to the filled first and second bowl regions; and
    wherein the forming of the first bowl regions is formed before the forming of the second trenches.

33. A method of forming an integrated assembly, comprising:

forming first trenches extending vertically into a semiconductor material; the first trenches being laterally spaced from one another;

forming first bowl regions along lower portions of the first trenches;

forming second trenches between the first trenches;

forming second bowl regions along lower portions of the second trenches; the first and second bowl regions merging with one another;

filling the first and second trenches and the first and second bowl regions with insulative material to form a construction comprising, along a cross-section, first posts alternating with second posts; the first posts comprising the semiconductor material and the second posts comprising the insulative material; the second posts merging with one another at bottom regions corresponding to the filled first and second bowl regions; and wherein the forming of the first bowl regions is formed before the forming of the second bowl regions.

34. A method of forming an integrated assembly, comprising:

forming first trenches extending vertically into a semiconductor material; the first trenches being laterally spaced from one another;

forming first bowl regions along lower portions of the first trenches;

forming second trenches between the first trenches;

forming second bowl regions along lower portions of the second trenches; the first and second bowl regions merging with one another;

filling the first and second trenches and the first and second bowl regions with insulative material to form a construction comprising, along a cross-section, first posts alternating with second posts; the first posts comprising the semiconductor material and the second posts comprising the insulative material; the second posts merging with one another at bottom regions corresponding to the filled first and second bowl regions; and wherein the forming of the first bowl regions is formed at a different method step than the forming of the second bowl regions.

35. A method of forming an integrated assembly, comprising:

forming first trenches extending vertically into a semiconductor material; the first trenches being laterally spaced from one another;

forming first bowl regions along lower portions of the first trenches;

forming second trenches between the first trenches;

forming second bowl regions along lower portions of the second trenches; the first and second bowl regions merging with one another;

filling the first and second trenches and the first and second bowl regions with insulative material to form a construction comprising, along a cross-section, first posts alternating with second posts; the first posts comprising the semiconductor material and the second posts comprising the insulative material; the second posts merging with one another at bottom regions corresponding to the filled first and second bowl regions; and wherein the filling of the first trenches is filled at a different method step than the filling of the second trenches.

36. A method of forming an integrated assembly, comprising:

forming first trenches extending vertically into a semiconductor material; the first trenches being laterally spaced from one another;

forming first bowl regions along lower portions of the first trenches;

forming second trenches between the first trenches;

forming second bowl regions along lower portions of the second trenches; the first and second bowl regions merging with one another;

filling the first and second trenches and the first and second bowl regions with insulative material to form a construction comprising, along a cross-section, first posts alternating with second posts; the first posts comprising the semiconductor material and the second posts comprising the insulative material; the second posts merging with one another at bottom regions corresponding to the filled first and second bowl regions; and wherein the filling of the first bowl regions is filled at a different method step than the filling of the second bowl regions.

37. A method of forming an integrated assembly, comprising:

forming first trenches extending vertically into a semiconductor material; the first trenches being laterally spaced from one another;

forming first bowl regions along lower portions of the first trenches;

forming second trenches between the first trenches;

forming second bowl regions along lower portions of the second trenches; the first and second bowl regions merging with one another;

filling the first and second trenches and the first and second bowl regions with insulative material to form a construction comprising, along a cross-section, first posts alternating with second posts; the first posts comprising the semiconductor material and the second posts comprising the insulative material; the second posts merging with one another at bottom regions corresponding to the filled first and second bowl regions; and wherein the filling of the first bowl regions is filled before the forming of the second trenches.

38. A method of forming an integrated assembly, comprising:

forming first trenches extending vertically into a semiconductor material; the first trenches being laterally spaced from one another;

forming first bowl regions along lower portions of the first trenches;

forming second trenches between the first trenches;

forming second bowl regions along lower portions of the second trenches; the first and second bowl regions merging with one another;

filling the first and second trenches and the first and second bowl regions with insulative material to form a construction comprising, along a cross-section, first posts alternating with second posts; the first posts comprising the semiconductor material and the second posts comprising the insulative material; the second posts merging with one another at bottom regions corresponding to the filled first and second bowl regions; and wherein the filling of the first bowl regions is filled before the filling of the second bowl regions.

39. A method of forming an integrated assembly, comprising:
- forming first trenches extending vertically into a semiconductor material; the first trenches being laterally spaced from one another;
- forming first bowl regions along lower portions of the first trenches;
- forming second trenches between the first trenches;
- forming second bowl regions along lower portions of the second trenches; the first and second bowl regions merging with one another;
- filling the first and second trenches and the first and second bowl regions with insulative material to form a construction comprising, along a cross-section, first posts alternating with second posts; the first posts comprising the semiconductor material and the second posts comprising the insulative material; the second posts merging with one another at bottom regions corresponding to the filled first and second bowl regions; and
- wherein the filling of the first trenches is filled before the filling of the second trenches.

\* \* \* \* \*